US012744096B2

(12) United States Patent
Lee

(10) Patent No.: US 12,744,096 B2
(45) Date of Patent: Sep. 22, 2026

(54) NONVOLATILE MEMORY DEVICE AND OPERATING METHOD BASED ON PROGRAM EXECUTION AND/OR ERASE EXECUTION TIME

(71) Applicant: SAMSUNG ELECTRONICS CO., LTD., Suwon-si (KR)

(72) Inventor: Seunghan Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 161 days.

(21) Appl. No.: 18/735,986

(22) Filed: Jun. 6, 2024

(65) Prior Publication Data

US 2025/0210119 A1 Jun. 26, 2025

(30) Foreign Application Priority Data

Dec. 22, 2023 (KR) ........................ 10-2023-0189173

(51) Int. Cl.
*G11C 16/34* (2006.01)
*G11C 16/08* (2006.01)
(Continued)

(52) U.S. Cl.
CPC ............ *G11C 16/349* (2013.01); *G11C 16/08* (2013.01); *G11C 16/102* (2013.01); *G11C 16/32* (2013.01)

(58) Field of Classification Search
CPC ..... G11C 16/349; G11C 16/08; G11C 16/102; G11C 16/32; G11C 16/3431; G11C 16/0483; G11C 16/10; G11C 16/14; G11C 16/26; G11C 16/3409; G11C 16/3495; G11C 8/18; G11C 29/16; G11C 29/46; G11C 29/021; G11C 29/022; G11C 29/023; G11C 29/028; G11C 29/1201; G11C 29/52; G11C 2029/0409
See application file for complete search history.

(56) References Cited

U.S. PATENT DOCUMENTS

| | | | |
|---|---|---|---|
| 6,031,762 | A | 2/2000 | Saitoh |
| 8,755,233 | B2 | 6/2014 | Nagashima |

(Continued)

OTHER PUBLICATIONS

Shiuan-Hao Kuo, "Separate command address(SCA) NAND interface for client SSD applications", Flash Memory Summit, Aug. 2023, 30 pages, XP093180000, url: https://conferenceconcepts.app.box.com/s/hpu823k9jsljc49ayek5o4qy30z45qjz.

(Continued)

*Primary Examiner* — Sultana Begum
(74) *Attorney, Agent, or Firm* — Sughrue Mion, PLLC

(57) ABSTRACT

A storage device is provided. The storage device includes a nonvolatile memory device configured to receive a command and an address for a write operation or an erase operation via command-address pins, transmit and receive write data or read data via data pins, and generate degeneration information by measuring at least one of a program execution time to perform the write operation and an erase execution time to perform the erase operation; and a storage controller configured to receive the degeneration information from the nonvolatile memory device, and control the nonvolatile memory device to adjust at least one of a program voltage of the write operation and an erase voltage of the erase operation based on the degeneration information.

20 Claims, 25 Drawing Sheets

(51) Int. Cl.
*G11C 16/10* (2006.01)
*G11C 16/32* (2006.01)

(56) References Cited

U.S. PATENT DOCUMENTS

| | | | | |
|---|---|---|---|---|
| 8,929,150 | B2 | 1/2015 | Yang | |
| 10,109,355 | B2 | 10/2018 | Nagao | |
| 10,643,700 | B2 | 5/2020 | Qawami et al. | |
| 11,264,102 | B2 | 3/2022 | Tachi et al. | |
| 11,372,593 | B2 | 6/2022 | Lee et al. | |
| 11,600,344 | B2 | 3/2023 | Joo | |
| 11,994,942 | B2 | 5/2024 | Hartz et al. | |
| 2002/0080649 | A1* | 6/2002 | Yamada | G11C 11/5642 365/185.03 |
| 2010/0195387 | A1 | 8/2010 | Park et al. | |
| 2015/0380094 | A1 | 12/2015 | Nagashima | |
| 2017/0125099 | A1 | 5/2017 | Qawami et al. | |
| 2023/0195559 | A1 | 6/2023 | Hartz et al. | |

OTHER PUBLICATIONS

Communication issued on Jul. 12, 2024 by the European Patent Office for European Patent Application No. 24176675.7.

* cited by examiner

Figure 6A:
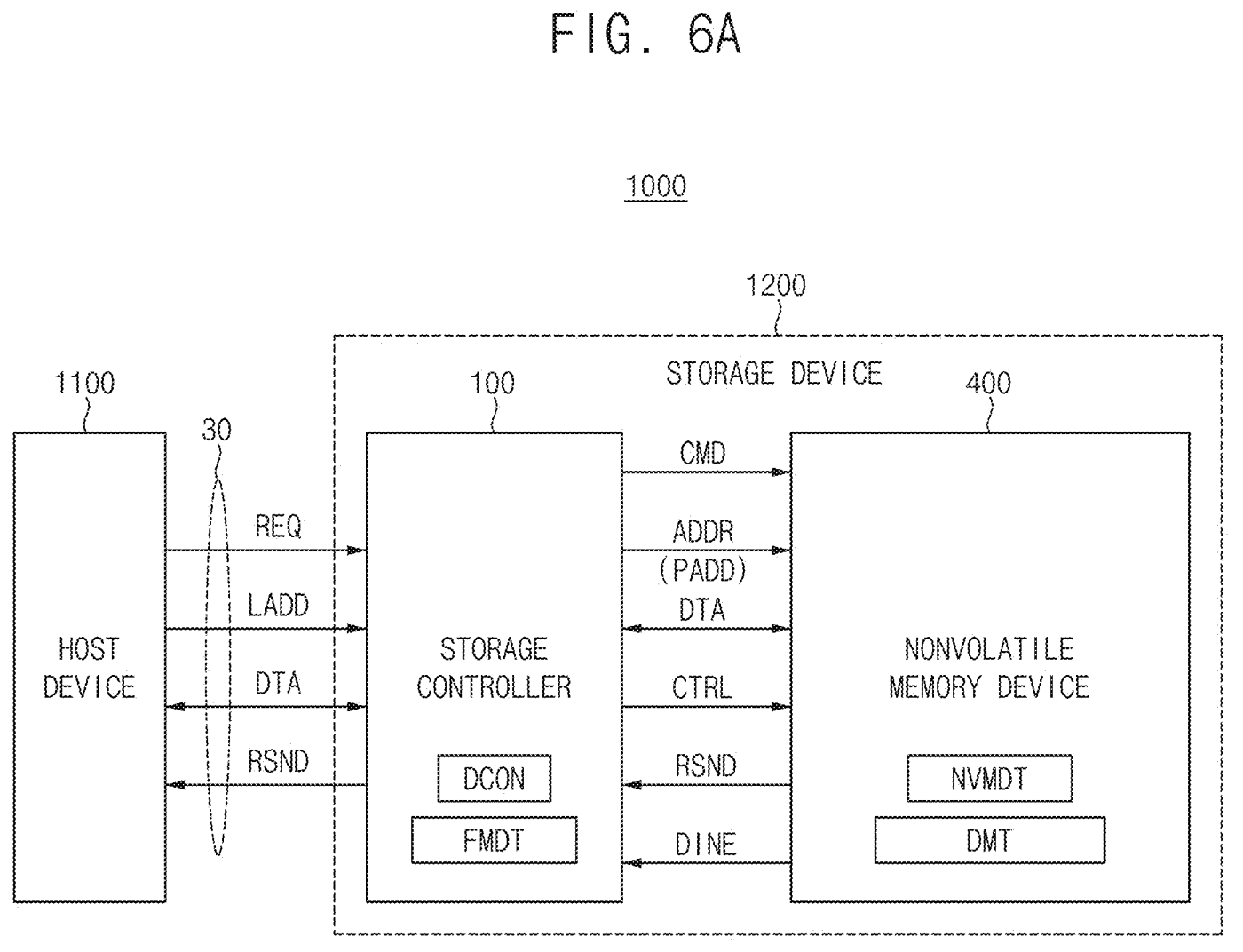

1100 HOST DEVICE

30

REQ
LADD
DTA
RSND

1200 STORAGE DEVICE

100 STORAGE CONTROLLER

DCON
FMDT

CMD
ADDR (PADD)
DTA
CTRL
RSND
DINE

400 NONVOLATILE MEMORY DEVICE

NVMDT
DMT

| tPROG | VPGM |
|---|---|
| t1<tPROG | VL1 |
| t2<tPROG≤t1 | VL2 |
| t3<tPROG≤t2 | VL3 |
| ⋮ | ⋮ |

500
VERS
510
MEMORY CELL ARRAY
BLK1
BLK2
BLKz
BL
530
PAGE BUFFER CIRCUIT
DL
540
DATA I/O CIRCUIT
DAT
DINF
DMT
570
SSL
WL
GSL
PBC
C_ADDR
R_ADDR
520
ADDRESS DECODER
VS
CONTROL CIRCUIT
560
CON
550
VOLTAGE GENERATOR
PWR
CMD
ADDR
R/B

Figure 14:
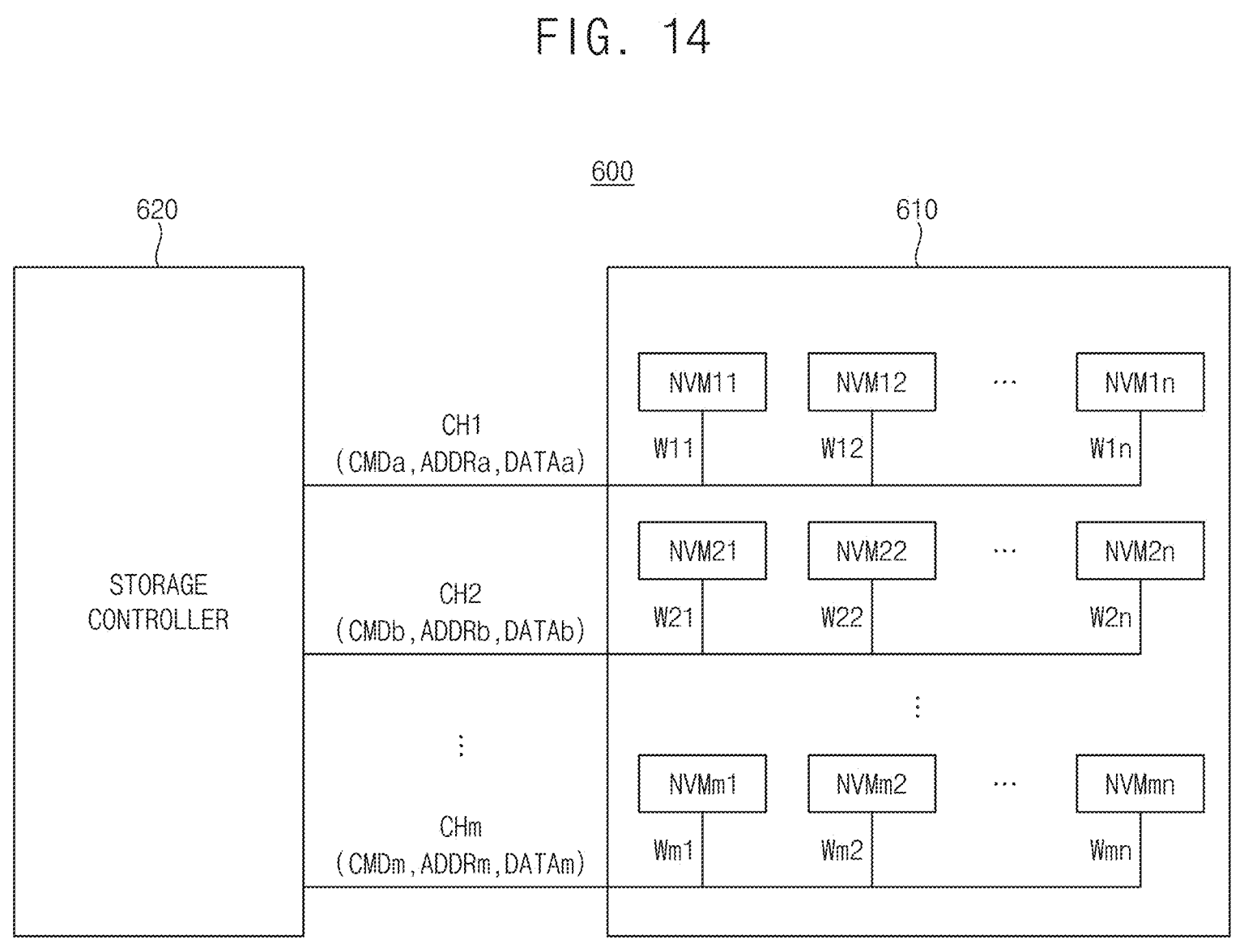

NVM11 W11
NVM12 W12
...
NVM1n W1n

NVM21 W21
NVM22 W22
...
NVM2n W2n

...

NVMm1 Wm1
NVMm2 Wm2
...
NVMmn Wmn

CH1 (CMDa, ADDRa, DATAa)

CH2 (CMDb, ADDRb, DATAb)

...

CHm (CMDm, ADDRm, DATAm)

620

STORAGE CONTROLLER

FIG. 19

CA_CLK
CA[1:0]
DQ[7:0]
R/B#
CMD1
ADD
CMD2
SCE
WDTA
SCT
CMD3
DINF
tPROG
P11
P12
P13

| BLK1 | CNT1 |
| --- | --- |
| BLK2 | CNT2 |
| BLK3 | CNT3 |
| ⋮ | ⋮ |

FIG. 27

| | | |
|---|---|---|
| BLK1 | SB1 (WL0~WLk) | CNT11 |
| | SB2 (WLk+1~WLn) | CNT12 |
| BLK2 | SB1 (WL0~WLk) | CNT21 |
| | SB2 (WLk+1~WLn) | CNT22 |
| ⋮ | ⋮ | ⋮ |

NONVOLATILE MEMORY DEVICE AND OPERATING METHOD BASED ON PROGRAM EXECUTION AND/OR ERASE EXECUTION TIME

CROSS-REFERENCE TO RELATED APPLICATION

This application claims priority to Korean Patent Application No. 10-2023-0189173, filed on Dec. 22, 2023, in the Korean Intellectual Property Office (KIPO), the disclosure of which is incorporated by reference herein in its entirety.

BACKGROUND

1. Field

Example embodiments relate generally to semiconductor integrated circuits, and more particularly to a nonvolatile memory device, a storage device including a nonvolatile memory device and a method of operating a storage device.

2. Discussion of Related Art

Recently, storage devices such as solid state drives (SSDs) have become widely used. A storage device may correspond to a memory system that includes a nonvolatile memory device, such as flash memory, and a storage controller (or memory controller) that controls the nonvolatile memory device. The nonvolatile memory device may communicate with the storage controller via predetermined pins according to a protocol to transmit and receive input and output signals. For example, the nonvolatile memory device may receive commands and addresses from the storage controller over certain input and output (I/O) pins, and may transmit and receive data to and from the storage controller over the same input and output pins. According to such an I/O interface, data may not be transferred while commands and/or addresses are being transferred, and efficiency of the I/O interface may be degraded. Accordingly, there is a need for an I/O interface that may efficiently transfer data between a nonvolatile memory device and a storage controller.

SUMMARY

Some example embodiments provide a nonvolatile memory device according to a Separate Command Address (SCA) protocol, a storage device including the nonvolatile memory device and a method of operating the storage device, capable of efficiently providing and reflecting a degree of degeneration of the nonvolatile memory device.

According to an aspect of one or more example embodiments, a storage device includes a nonvolatile memory device configured to receive a command and an address for a write operation or an erase operation via command-address pins, transmit and receive write data or read data via data pins, and generate degeneration information by measuring at least one of a program execution time to perform the write operation and an erase execution time to perform the erase operation; and a storage controller configured to receive the degeneration information from the nonvolatile memory device, and control the nonvolatile memory device to adjust at least one of a program voltage of the write operation and an erase voltage of the erase operation based on the degeneration information.

According to another aspect of one or more example embodiments, a method of operating a storage device including a nonvolatile memory device and a storage controller configured to control the nonvolatile memory device, includes: generating degeneration information by measuring at least one of a program execution time to perform a write operation and an erase execution time to perform an erase operation of the nonvolatile memory device; providing the degeneration information from the nonvolatile memory device to the storage controller; and controlling the nonvolatile memory device to adjust at least one of a program voltage of the write operation and an erase voltage of the erase operation based on the degeneration information.

According to another aspect of one or more example embodiments, a memory cell array including a plurality of nonvolatile memory cells; command-address pins configured to communicate a command and an address for a write operation or an erase operation; data pins configured to communicate write data and readout data; a state pin configured to communicate a state signal that is activated at a first logic level indicating a ready state while in the ready state and deactivated at a second logic level indicating a busy state while performing internal operations for the write operation or the erase operation, and a degeneration detector circuit configured to generate degeneration information by identifying at least one of a program execution time to perform the write operation and an erase execution time to perform the erase operation, based on the state signal.

BRIEF DESCRIPTION OF DRAWINGS

The above and other aspects and features will be more apparent from the following description of example embodiments, taken in conjunction with the accompanying drawings.

FIG. 6A is a block diagram illustrating a storage system according to example embodiments.

FIG. 14 is a block diagram illustrating storage device according to example embodiments.

FIG. 19 is a timing diagram illustrating an example embodiment of a write operation of a nonvolatile memory device according to example embodiments.

FIG. 25 is a diagram illustrating an example embodiment of adjusting an erase voltage of a storage device according to example embodiments.

FIGS. 26 and 27 are diagrams illustrating example embodiment of degeneration information in a method of operating a storage device according to example embodiments.

DETAILED DESCRIPTION

Hereinafter, example embodiments will be described with reference to the accompanying drawings. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
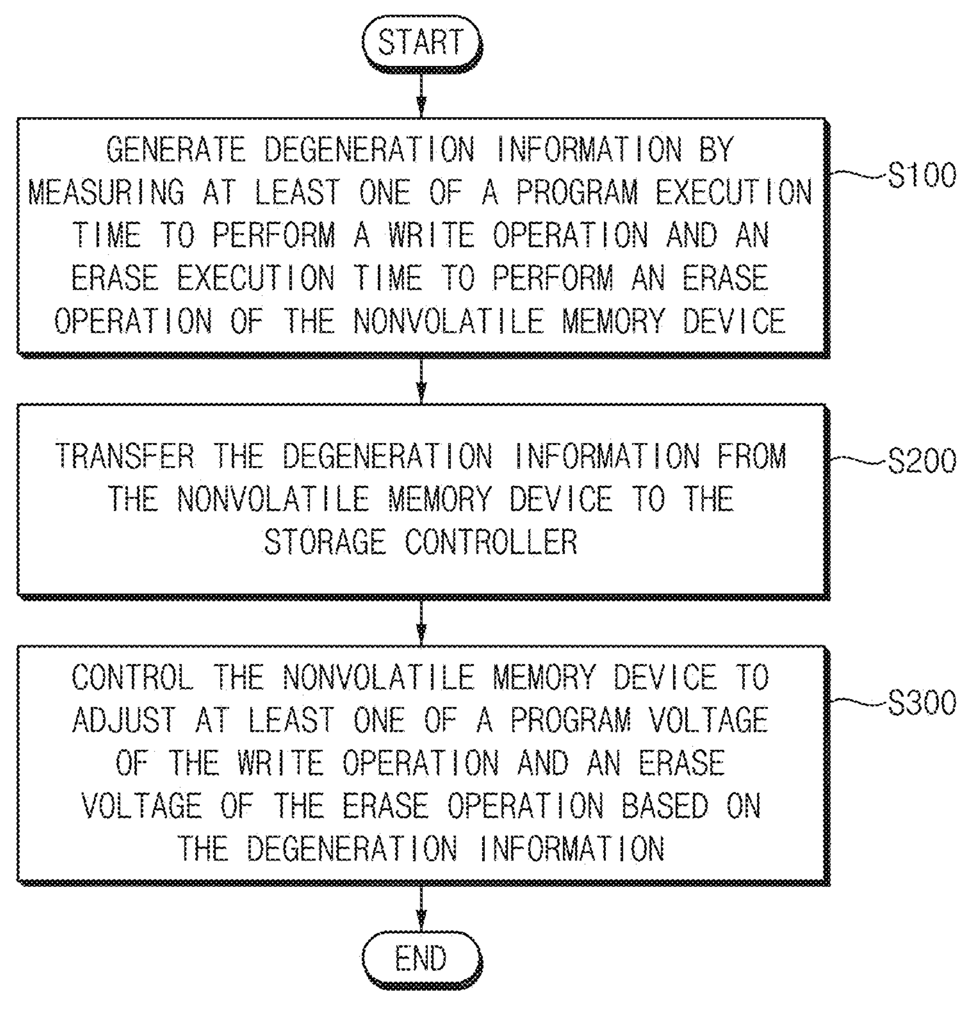
FIG. 1 is a flowchart illustrating a method of operating a storage device according to example embodiments.

FIG. 1 is a flowchart illustrating a method of operating a storage device according to example embodiments. As will be described below, a storage device includes a nonvolatile memory device and a storage controller configured to control the nonvolatile memory device.

Referring to FIG. 1, degeneration information may be generated by measuring at least one of a program execution time to perform a write operation and an erase execution time to perform an erase operation of the nonvolatile memory device (S100). In one example embodiment, as will be described below with reference to FIGS. 18 and 19, the degeneration information may be generated by measuring the program execution time taken to perform the write operation. In another example embodiment, as will be described below with reference to FIGS. 23 and 24, the degeneration information may be generated by measuring the erase execution time taken to perform the erase operation.

The degeneration information may be transferred from (i.e., provided by) the nonvolatile memory device to the storage controller (S200). In some example embodiments, as will be further described with reference to FIGS. 7 through 9, the nonvolatile memory device and the storage controller may transfer commands and addresses via command-address pins and data via data pins distinct from the command-address pins. In one example embodiment, the nonvolatile memory device may transfer the degeneration information to the storage controller via the command-address pins.

The storage controller may control the nonvolatile memory device to adjust at least one of a program voltage for the write operation and an erase voltage for the erase operation, based on the degeneration information (S300).

In one example embodiment, as will be described below with reference to FIGS. 2, 3 and 20, the storage controller may control, based on the measured program execution time, the nonvolatile memory device to decrease the program voltage as the degree of degeneration of the nonvolatile memory device increases, i.e., as the measured program execution time included in the degeneration information decreases. By reducing the program voltage of the nonvolatile memory device to reflect the actual degree of degeneration based on the degeneration information, the storage controller may reduce the stress on the nonvolatile memory cells and improve the performance and lifetime of the nonvolatile memory device and storage device.

In another example embodiment, as will be described below with reference to FIGS. 4, 5 and 25, the storage controller may control, based on the measured erase execution time, the nonvolatile memory device to increase the erase voltage as the degree of degeneration of the nonvolatile memory device increases included in the degeneration information, i.e., as the measured erase execution time increases. Based on the measured degeneration information, the storage controller may increase the erase voltage of the nonvolatile memory device to reflect the actual degree of degeneration, thereby reducing the erase time of the nonvolatile memory device and improving the performance of the nonvolatile memory device and the storage device.

Figure 2:
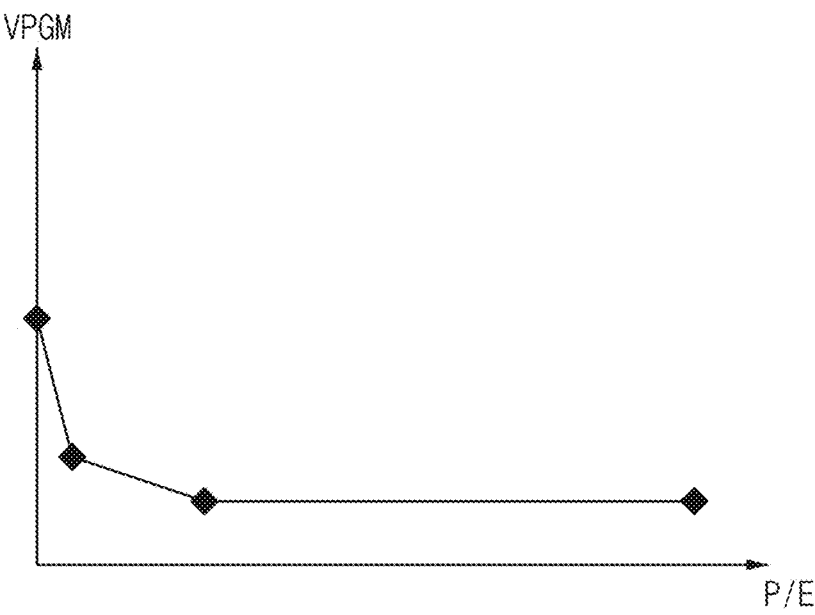
FIGS. 2 and 3 are diagrams illustrating example embodiments of adjusting a program voltage of a storage device according to example embodiments.
Figure 3:
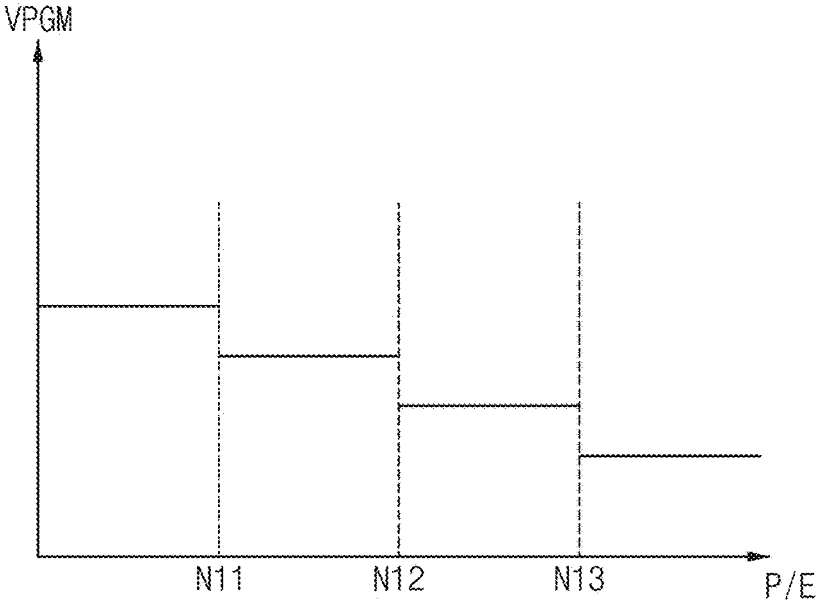

FIGS. 2 and 3 are diagrams illustrating example embodiments of adjusting a program voltage of a storage device according to example embodiments.

FIG. 2 illustrates a general trend of the optimal program voltage VPGM as a function of a program-erase count (or a program-erase cycle) P/E of a nonvolatile memory device. As the program-erase count P/E increases, electrons are trapped in the tunneling oxide between the floating gate and the channel as the nitride floating gate of the memory cells in the nonvolatile memory device is repeatedly drawn in and out of the nitride. Therefore, as the program-erase count P/E increases, the trapped electrons speed up the program (i.e., write) operations. In this regard, increasing the program-erase count P/E makes programming easier and stress on the memory cells may be unnecessarily increased if the same program voltage VPGM is maintained.

FIG. 3 illustrates one example embodiment of adjusting the program voltage VPGM of the storage device in accordance with example embodiments. Referring to FIG. 3, the storage controller may control the nonvolatile memory device based on degeneration information such that the program voltage VPGM decreases as the degree of degeneration of the nonvolatile memory device increases. In one example embodiment, the degeneration information may be updated each time the program-erase count P/E reach each of the threshold counts N11, N12 and N13, respectively, and the program voltage VPGM may be decreased in a stepwise manner as shown in FIG. 3 in response to the update of the degeneration information.

Figure 4:
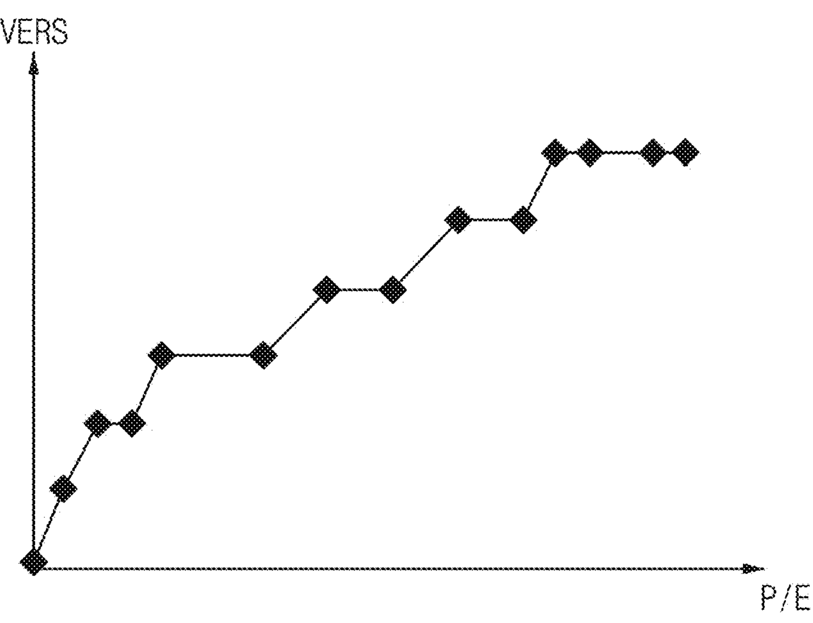
FIGS. 4 and 5 are diagrams illustrating example embodiments of adjusting an erase voltage of a storage device according to example embodiments.
Figure 5:
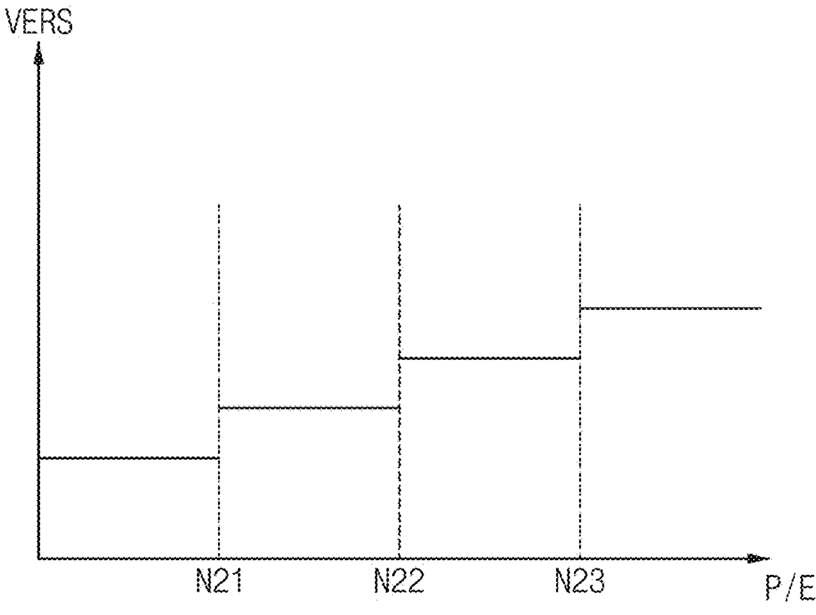

FIGS. 4 and 5 are diagrams illustrating example embodiments of adjusting an erase voltage of a storage device according to example embodiments.

FIG. 4 illustrates a general trend of the optimal erase voltage VERS as a function of a program-erase count P/E of a nonvolatile memory device. As described above, as the program-erase count P/E increases, electrons are trapped in the tunneling oxide between the floating gate and the channel as electrons are repeatedly put in and taken out of the nitride floating gate of the memory cells of the nonvolatile memory device. Therefore, as the program-erase count P/E increases, the erasure rate is slowed down by the trapped electrons. In this regard, as the program-erase count P/E increases, erasing becomes more difficult and the erase time unnecessarily increases when the same erase voltage VERS is maintained.

FIG. 5 illustrates one example embodiment of adjusting the erase voltage VERS of the storage device according to example embodiments. Referring to FIG. 5, the storage controller may control the nonvolatile memory device based on degeneration information such that the erase voltage VERS increases as the degree of degeneration of the nonvolatile memory device increases. In one example embodiment, the degeneration information may be updated each time the program-erase count reach each of the reference counts N21, N22 and N23, respectively, and the erase voltage VERS may be incrementally increased as shown in FIG. 5 in response to the update of the degeneration information.

The operation voltage of the nonvolatile memory device may be adjusted uniformly based on the program-erase count P/E. In this case, the stress on the memory cells may increase or the operation speed may decrease depending on the nonvolatile memory devices, because it is not possible to reflect the degeneration characteristics of the respective nonvolatile memory device.

In accordance with example embodiments, the performance and lifetime of the storage device may be improved by measuring at least one of the program execution time and the erase execution time to provide the degeneration information indicating the actual degree of degeneration of the nonvolatile memory device, and adjusting the program voltage VPGM and/or the erase voltage VERS to reflect the actual degree of degeneration based on the measured degeneration information.

FIGS. 3 and 5 illustrate example embodiments of measuring the program execution time tPROG and/or the erase execution time tERS based on the program-erase count P/E, but example embodiments are not limited thereto. In accordance with example embodiments, the nonvolatile memory device may measure the program execution time tPROG and/or the erase execution time tERS in response to a request from the host device or the storage controller. The program execution time tPROG and/or the erase execution time tERS may be performed during normal operation of the nonvolatile memory device, or may be performed during test operation of the nonvolatile memory device.

Figure 6B:
FIG. 6B is a diagram illustrating an example embodiment of a reference table that is managed by a degeneration controller included in a storage device according to example embodiments.

FIG. 6A is a block diagram illustrating a storage system according to example embodiments, and FIG. 6B is a diagram illustrating an example embodiment of a reference table that is managed by a degeneration controller included in a storage device according to example embodiments.

Referring to FIG. 6A, a storage system 1000 may include a host device 1100, a storage device 1200 and a link 30 connecting the host device 1100 and the storage device 1200. The storage device 1200 may include a storage controller 100 and a nonvolatile memory device 400. The nonvolatile memory device 400 may include a degeneration detector DMT (i.e., degeneration detector circuitry), and the degeneration detector DMT may generate degeneration information DINF by measuring at least one of the program execution time spent for performing the write operation and the erase execution time spent for performing the erase operation.

The degeneration information DINF generated by the nonvolatile memory device 400 is transmitted to the storage controller 100. The storage controller 100 may include a degeneration controller DCON, and the degeneration controller DCON may adjust the program voltage VPGM and/or the erase voltage VERS of the nonvolatile memory device 400 based on the degeneration information DINF. According to example embodiments, the degeneration controller DCON may be implemented in the form of hardware or firmware.

The storage controller 100 may manage the degeneration information DINF as a portion of metadata. The metadata is distinct from user data stored in the nonvolatile memory device 400 at the request of the host device 1100, and is data generated and managed by the firmware of the storage controller 100 to manage the user data or the nonvolatile memory device 400. The metadata may include a mapping table representing a mapping relationship between logical addresses of the host device 1100 and physical addresses of the nonvolatile memory 400. In addition, the metadata may include other information for managing the memory space of the nonvolatile memory device 400.

The metadata may be loaded from the nonvolatile memory device 400 at power-on of the storage system 1000 and stored in memory of the storage controller 100, for example, volatile memory such as DRAM or SRAM. The metadata stored in the nonvolatile memory device 400 may be referred to as nonvolatile metadata NVMDT, and the metadata stored in the storage controller 100 may be referred to as firmware metadata FMDT. The firmware metadata FMDT may change during operation of the storage device 1200, and journaling techniques may be utilized to maintain consistency between the firmware metadata FMDT and the nonvolatile metadata NVMDT.

Referring to FIG. 6B, the degeneration controller DCON may manage a reference table RFTB representing a mapping relationship between a plurality of intervals of program execution time tPROG and program voltage VPGM. The reference table RFTB may be generated through testing of the nonvolatile memory device and stored in the storage device 1200. FIG. 6B illustrates a case where the degeneration information DINF indicates program execution time tPROG, but example embodiments are not limited thereto.

If the measured program execution time tPROG is greater than a first time t1, the degeneration controller DCON may set the program voltage VPGM to a first voltage level VL1. If further degeneration occurs and the measured program execution time tPROG is greater than a second time t2 and less than or equal to the first time t1, the degeneration controller DCON may set the program voltage VPGM to a second voltage level VL2 that is lower than the first voltage level VL1. If the degeneration progresses further and the measured program execution time tPROG is greater than a second time t3 and less than or equal to the second time t2, the degeneration controller DCON may set the program voltage VPGM to a third voltage level VL3 that is lower than the second voltage level VL2.

In this way, by reducing the program voltage of the nonvolatile memory device to reflect the actual degree of degeneration based on the above measured degeneration information, the stress on the nonvolatile memory cells may be reduced and the performance and lifetime of the non-volatile memory device and storage device may be improved.

For example, the storage device 1200 may be a solid state drive (SSD), an embedded multimedia card (eMMC), a universal flash storage (UFS) device, or the like. In one example embodiment, the link 30 may be a peripheral component interconnect (PCI) express (PCIe) link.

The host device 1100 may be a data processing device capable of processing data, such as a central processing unit (CPU), a processor, a microprocessor, or an application processor. The storage device 1200 may be embedded in an electronic device with the host device 1100, or it may be removably electrically connected to an electronic device that includes the host device 1100.

The host device 1100 may send a data access request, i.e., a request REQ and a logical address LADD, to the storage controller 100, and may send and receive data DTA to and from the storage controller 100. The storage controller 100 may send a response RSND to the host device 1100 in response to the data action request REQ. The data access request REQ may include a data read request, a data write request, and a data erase request.

The storage controller 100 may control the nonvolatile memory device 400 in response to the request REQ from the host device 1100. By providing the nonvolatile memory device 400 with an address ADDR (i.e., a physical address PADD) that maps to the logical address LADD, the command CMD, and a control signal CTRL, the storage controller 100 may perform read operations and write operations on the nonvolatile memory device 400. The write operations may be referred to as program operations. For example, the storage controller 100 may perform a flash translation layer FTL operation to convert the logical address LADD transmitted from the host device 1100 to the physical address PADD.

For example, the storage controller 100 may control the nonvolatile memory device 400 to read data stored in the nonvolatile memory device 400 in response to a data read request received from the host device 1100, or to write data to the nonvolatile memory device 400 in response to a data write request received from the host device 1100. Further, the nonvolatile memory device 400 may be controlled to erase the data stored in the nonvolatile memory device 400 in response to an erase request received from the host device 1100. The nonvolatile memory device 400 may transmit a response RSND responding to the command CMD to the storage controller 100.

The nonvolatile memory device 400 may be implemented using one or more nonvolatile memories NVMs, such as flash memory, magnetic RAM (MRAM), ferroelectric RAM (FeRAM), phase change RAM (PRAM), and resistive RAM (ReRAM). The nonvolatile memory device 400 may be connected to the storage controller 100 via a plurality of channels. For convenience of descriptions, the nonvolatile memory device 400 may be exemplified and described below as a NAND flash memory device.

Figure 7:
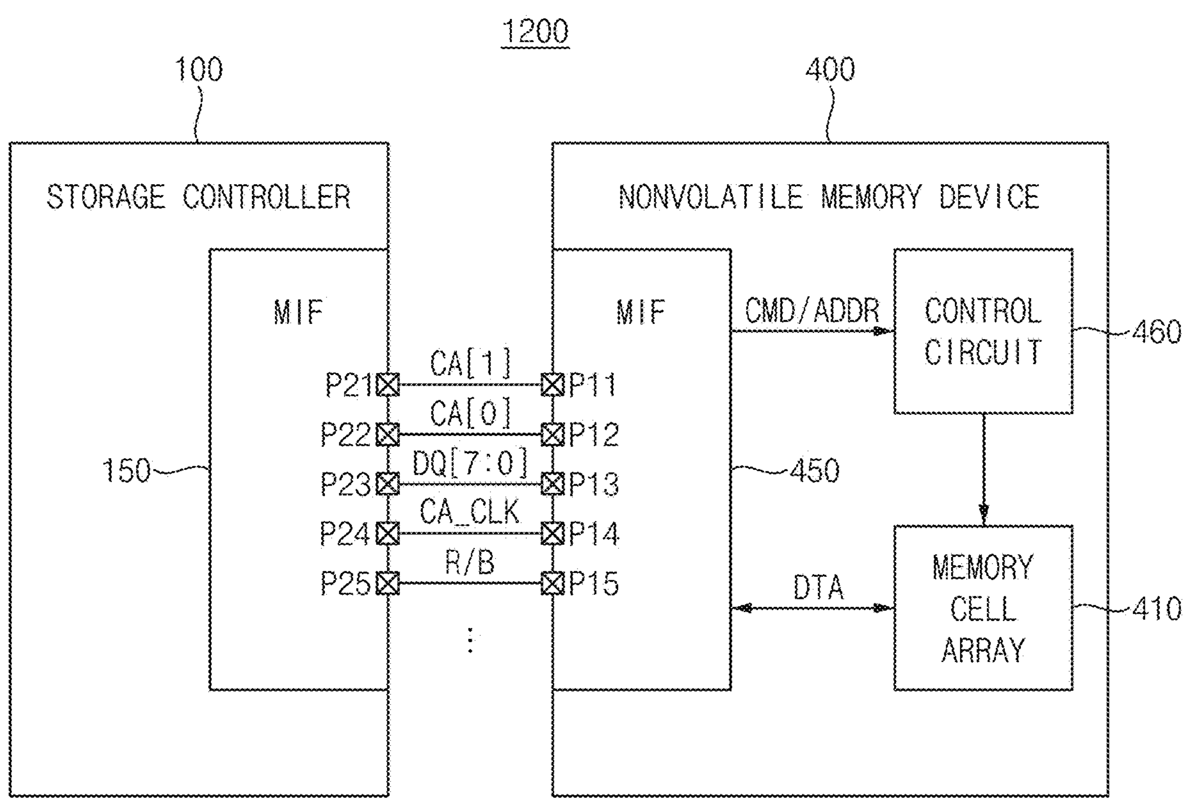
FIG. 7 is a block diagram illustrating a storage device according to example embodiments.

FIG. 7 is a block diagram illustrating a storage device according to example embodiments.

Referring to FIG. 7, a storage device 1200 may include a storage controller 100 and a nonvolatile memory device 400. As will be described below with reference to FIG. 14, the nonvolatile memory device 400 may correspond to one of a plurality of nonvolatile memory devices NVM11 to NVMmn in communication with the storage controller 100 based on one of a plurality of channels CH1 to CHm. The storage controller 100 may correspond to the storage controller 100 of FIG. 6A.

The nonvolatile memory device 400 may include a memory interface circuit (MIF) 450, first through fifth pins P11 through P15 connected to the memory interface circuit (MIF) 450, a memory cell array 410, and a control circuit 460. The memory interface circuit 450 may transmit and receive command-address signals CA[1] and CA[0], data signals DQ[7:0], a command-address clock signal CA_CLK, and a state signal R/B via the first through fifth pins P11~P15. The command-address clock signal CA_CLK may be referred to as a command-address strobe signal, and the state signal R/B may be referred to as a ready-busy signal.

The memory interface circuit 450 may receive command-address signals CA[1] and CA[0] from the storage controller 100 via first and second pins P11 and P12 corresponding to command-address pins. The memory interface circuit 450 may receive data signals DQ[7:0] from the storage controller 100 as well as transmit data signals DQ[7:0] to the storage controller 100, via the third pins P13 corresponding to the data pins. In addition, the memory interface circuit 450 may receive a command-address clock signal CA_CLK from the storage controller 100 via the fourth pin P14, and may transmit a state signal R/B to the storage controller 100 via the fifth pin P15 corresponding to a state pin.

The command-address clock signal CA_CLK may remain in a static state (e.g., high level or low level) and then toggle between high and low levels in certain intervals. For example, the command-address clock signal CA_CLK may toggle during intervals when a command CMD or an address ADDR is being transferred. In this case, the memory interface circuit 450 may sample the command CMD or the address ADDR based on the command-address clock signal CA_CLK. For example, the memory interface circuit 450 may sample the command CMD or the address ADDR during intervals in which the command-address clock signal CA_CLK toggles.

The control circuit 460 may provide overall control of various operations of the nonvolatile memory device 400. The control circuit 460 may receive command/address CMD/ADDR obtained from the memory interface circuit 450. The control circuit 460 may generate control signals to control other components of the nonvolatile memory device 400 based on the received command/address CMD/ADDR. For example, the control circuit 460 may generate various control signals to program data into the memory cell array 410, or to read data from the memory cell array 410.

The memory cell array 410 may store the DTA obtained from the memory interface circuit 450 under the control of the control circuit 460. Further, the memory cell array 410 may output the stored data DTA to the memory interface circuit 450 under control of the control circuit 460.

The memory cell array 410 may include a plurality of nonvolatile memory cells. For example, the plurality of memory cells may be flash memory cells. However, example embodiments are not limited thereto, and the memory cells may be Resistive Random Access Memory (RRAM) cells, Ferroelectric Random Access Memory (FRAM) cells, Phase Change Random Access Memory (PRAM) cells, Thyristor Random Access Memory (TRAM) cells, Magnetic Random Access Memory (MRAM) cells. In this disclosure, example embodiments will be described with emphasis on the case where the memory cells are NAND flash memory cells.

The storage controller 100 may include memory interface circuit 150, and first through fifth pins P21~P25 connected to the memory interface circuit 150. The first through fifth pins P21~P24 may correspond to the first through fifth pins P11~P15 of the nonvolatile memory device 400, respectively. Accordingly, the memory interface circuit 150 may transmit the command-address signals CA[1] and CA[0], the data signals DQ[7:0], and the command-address clock signal CA_CLK and receive the state signal R/B via the first through fifth pins P21~P25.

Figure 8:
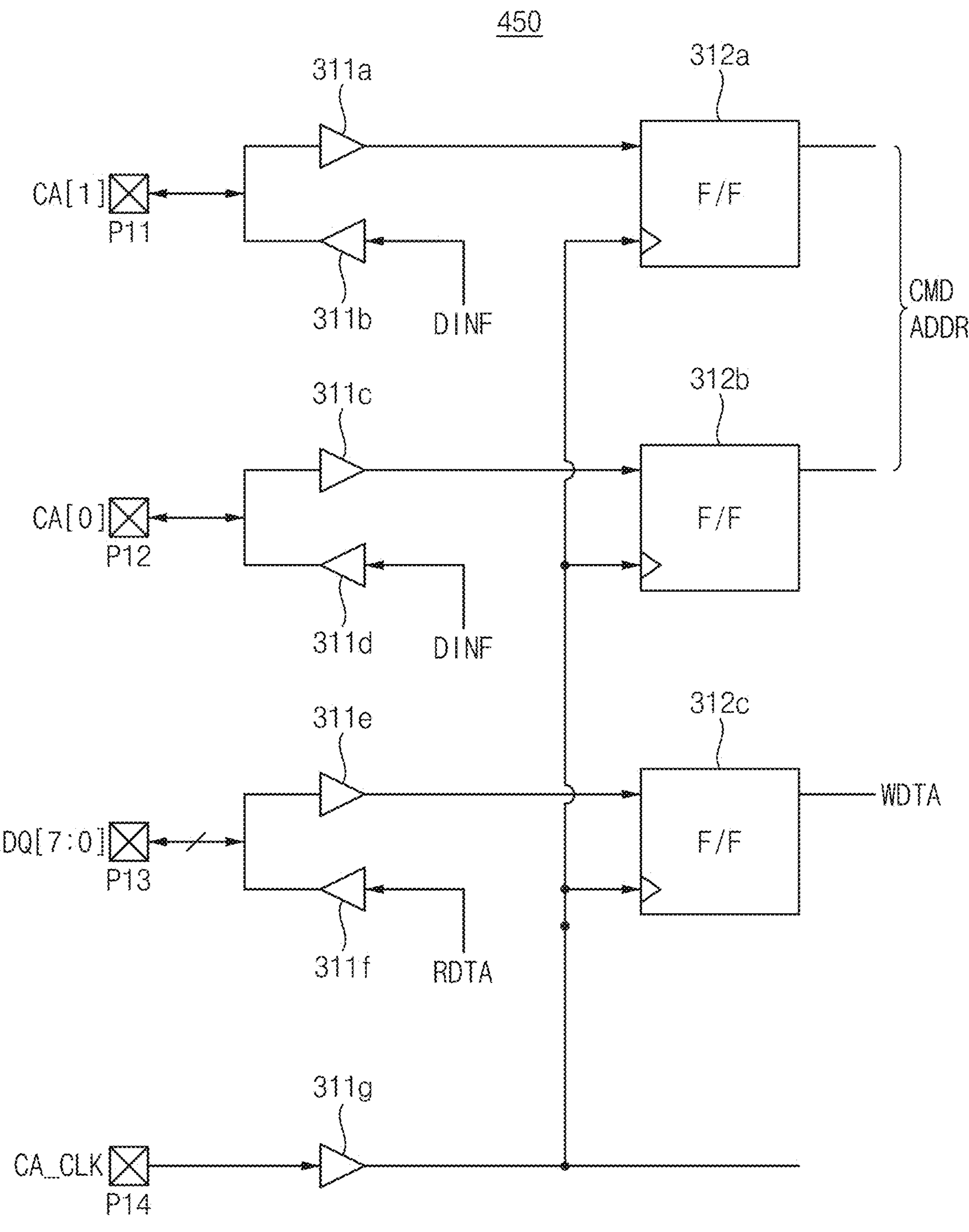
FIG. 8 is a diagram illustrating an example embodiment of an interface of a nonvolatile memory device according to example embodiments.
Figure 9:
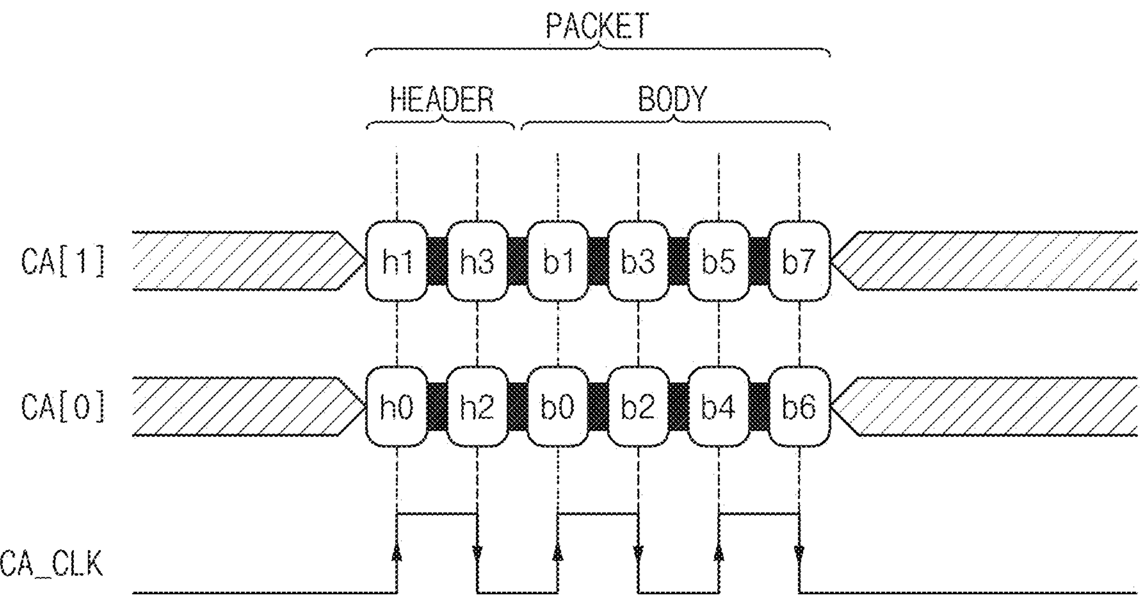
FIG. 9 is a timing diagram illustrating an example embodiment of transferring a command and an address in a storage device according to example embodiments.

FIG. 8 is a diagram illustrating an example embodiment of an interface of a nonvolatile memory device according to example embodiments, and FIG. 9 is a timing diagram illustrating an example embodiment of transferring a command and an address in a storage device according to example embodiments.

Referring to FIG. 8, a memory interface circuit 450 may include buffers 311*a*~311*g* and first through third flip-flops 312*a*~312*c*.

The command-address signals CA[1] and CA[0] and the data signals DQ[7:0] received via the first through third pins P11~P13) may be provided to the first, second and third flip-flops 312*a*, 312*b* and 313*c* via buffers 311*a*, 311*c* and 311*e*, respectively. The command-address clock signal CA_CLK received through the fourth pin P14 may be provided to the first, second and third flip-flops 312*a*, 312*b* and 313*c* via the buffer 311*g*. The first, second and third flip-flops 312*a*, 312*b* and 313*c* may sample the command-address signals CA[1] and CA[0] and the data signals DQ[7:0] on the rising and falling edges of the command-address clock signal CA_CLK, as shown in FIG. 9, and output the sampled command CMD, address ADDR, and write data WDTA.

In accordance with example embodiments, the memory interface circuit 450 may transmit degeneration information DINF of the nonvolatile memory device 400 to the storage controller 100 via at least one of the first pin P11 and the second pin P12. For example, as shown in FIG. 8, the buffers 311*b* and 311*d* may transmit command-address signals CA[1] and CA[0] that include the degeneration information DINF to the storage controller 100. In this way, communication between the nonvolatile memory device and the storage controller may be performed efficiently by carrying the degeneration information DINF and the data DTA over different pins. For example, while the data DTA is being transmitted from the nonvolatile memory device (e.g., the nonvolatile memory device NVM11 of FIG. 14) to the storage controller 100, the degeneration information DINF of another nonvolatile memory device (e.g., the nonvolatile memory device NVM12 of FIG. 14) may be provided to the storage controller 100 from another nonvolatile memory device (e.g., the nonvolatile memory device NVM12 of FIG. 14).

Referring to FIG. 9, the commands and addresses transmitted through the command-address signals CA[1] and CA[0] may be transmitted in the form of packets. Each of the packets may include a header and a body, and each bit may be sampled in synchronization with the rising and falling edges of the command-address clock signal CA_CLK.

The header may include four bits h0~h3, and the body may include eight bits b0~b7). Depending on the value of the bits h0~h3 in the header, the bits b0~b7 in the body may be categorized as the command CMD, the address ADDR, or the like.

The interface between the nonvolatile memory device and the storage controller described with reference to FIGS. 7 through 9 may conform to the Separate Command Address (SCA) protocol. In accordance with the SCA protocol, data signals and command-address signals may be transmitted on separate data pins and command-address pins.

Figure 10:
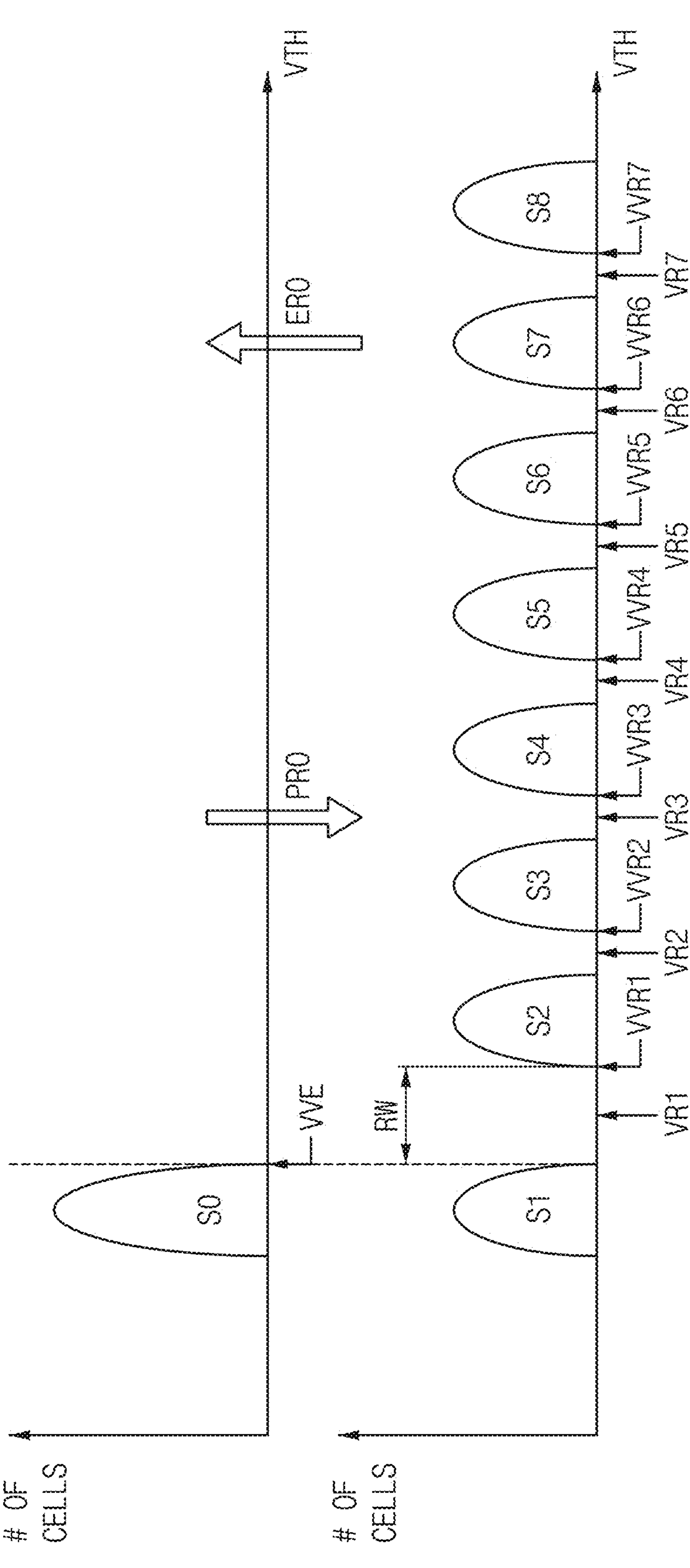
FIG. 10 is a diagram illustrating state change of memory cells of a nonvolatile memory device according to example embodiments.

FIG. 10 is a diagram illustrating state change of memory cells of a nonvolatile memory device according to example embodiments.

In FIG. 10, a horizontal axis represents a threshold voltage VTH of memory cells, and a vertical axis represents the number of the memory cells corresponding to the threshold voltage VTH. Although FIG. 10 shows a triple level cell (TLC) scheme in which each memory cell stores a 3-bit value, example embodiments are not limited thereto, and the number of bits stored in each selected memory cell may be determined variously.

Referring to FIG. 10, memory cells may be erased to an erase state S0 with a threshold voltage lower than an erase verification voltage VVE by an erase operation ERO.

Thereafter, a program operation PRO may be performed such that each memory cell corresponds to one state corresponding to write data among the first through eighth states S1~S8. Here, the first state S1 corresponds to an erase state. During the program operation PRO, the program execution results for the first through eighth states S1~S8 may be determined by sequentially applying the first through seventh verification read voltages VVR1~VVR7 to the selected wordline. Additionally, during the read operation, each bit of the first through eighth states S1~S8 may be determined by sequentially applying the normal read voltages VR1~VR7 to the selected wordline.

Figure 11:
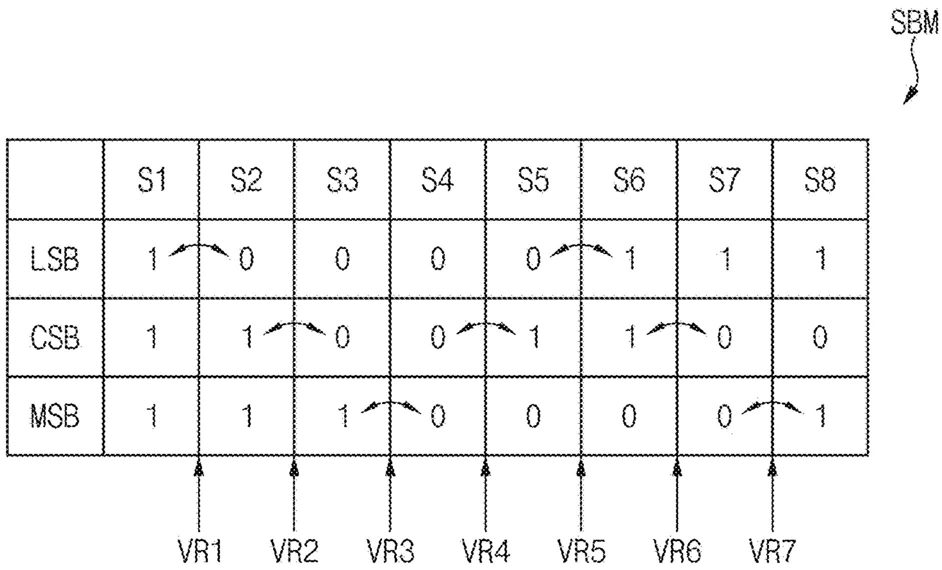
FIG. 11 is a diagram illustrating an example of state-bit mapping information indicating mapping relationship between states in FIG. 10 and bit values.

FIG. 11 is a diagram illustrating an example of state-bit mapping information indicating mapping relationship between states in FIG. 10 and bit values.

Referring to FIG. 11, state-bit mapping information SBM may indicate the mapping relationships between the states and the bits stored in the plurality of multi-level cells.

FIG. 11 illustrates an example of bit values corresponding to the first through eighth states S1~S8 in FIG. 10. The first through eighth states S1~S8 may be represented by different values corresponding to least significant bit (LSB), a centered bit (CSB) and a most significant bit (MSB), that is, different values of first, second and third bits LSB, CSB and MSB. For example, as illustrated in FIG. 11, the first state S1 corresponds to '111', the second state S2 corresponds to '110', the third state S3 corresponds to '100', the fourth state S4 corresponds to '000', the fifth S5 state corresponds to '010', the sixth S6 state corresponds to '011', the seventh state S7 corresponds to '001', and the eighth state S8 corresponds to '101'.

In this case, the first bit LSB may be determined using the first read voltage VR1 and the fifth read voltage VR5, the second bit CSB may be determined using the second read voltage VR2, the fourth read voltage VR4 and the sixth read voltage VR6, and the third bit MSB may be determined using the third read voltage VR3 and the seventh read voltage VR7.

As the memory cells are degenerated, the read margin or read window RW may become narrower. As the read window RW narrows, errors increase when determining the erased first state S1 and the programmed second state S2 and the performance of the nonvolatile memory device may deteriorate. According to example embodiments, stress on memory cells may be reduced by adjusting the program voltage and/or the erase voltage to reflect the actual degree of degeneration of the memory cells, thereby reducing degeneration of the memory cells.

Figure 12:
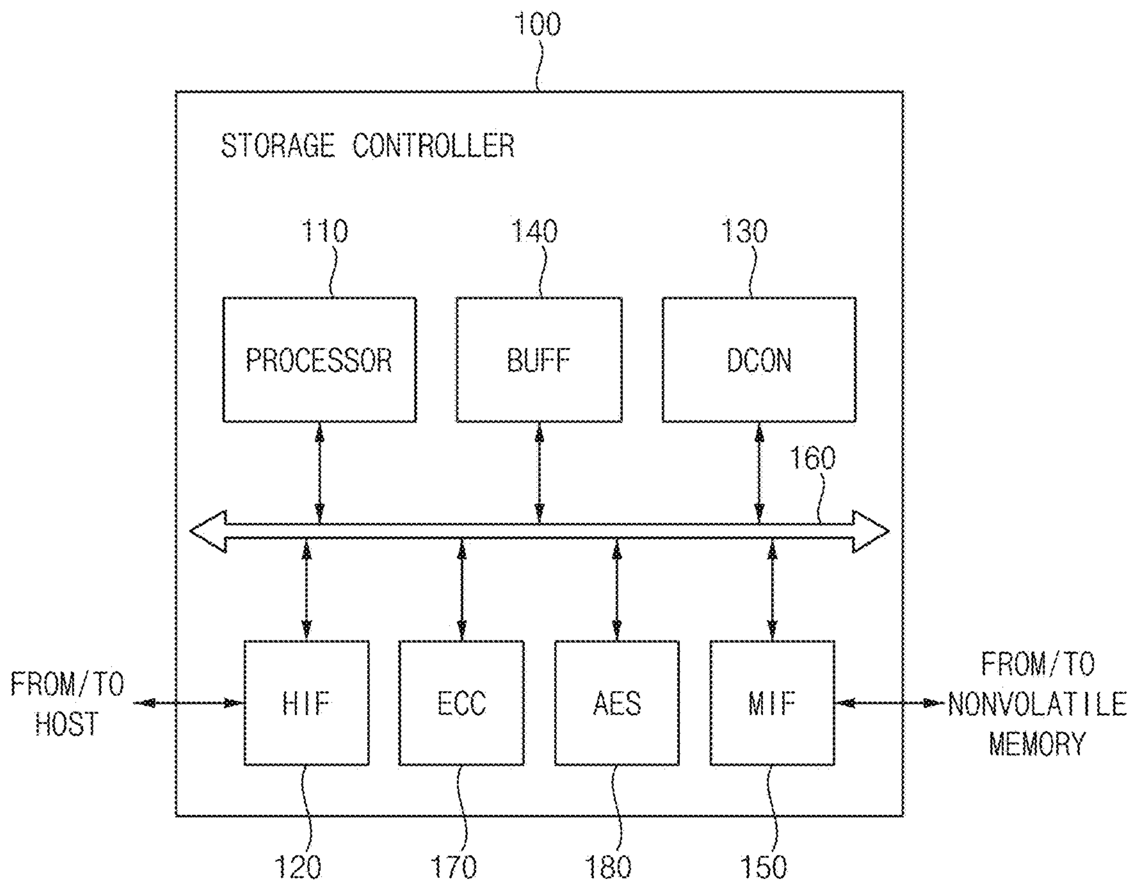
FIG. 12 is a block diagram illustrating a storage controller included in a storage device according to example embodiments.

FIG. 12 is a block diagram illustrating a storage controller included in a storage device according to example embodiments.

Referring to FIG. 12, a storage controller 100 may include a processor 110, a buffer memory (BUFF) 140, a degeneration controller (DCON) 130, a host interface (HIF) 120, an error correction code (ECC) engine 170, a memory interface (MIF) circuit 150, an advanced encryption standard (AES) engine 180, and an internal bus system 160 that connects the components in the storage controller 100.

The processor 110 may control an operation of the storage controller 100 in response to commands received via the host interface 120 from a host device (e.g., the host device 1100 in FIG. 6A). For example, the processor 110 may control an operation of a storage device (e.g., the storage device 1200 in FIG. 6A), and may control respective components by employing firmware for operating the storage device.

The buffer memory 140 may store instructions and data executed and processed by the processor 110. For example, the buffer memory 140 may be implemented with a volatile memory, such as a DRAM, a SRAM, a cache memory, or the like.

The ECC engine 170 for error correction may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), or the like. In some example embodiments, the ECC engine 170 may perform ECC encoding and ECC decoding using above-described codes or other error correction codes.

The host interface 120 may provide physical connections between the host device 1100 and the storage device 1200. The host interface 120 may provide an interface that corresponds to a bus format of the host device 1100 for communication between the host device 1100 and the storage device 1200. In some example embodiments, the bus format of the host device 1100 may be a small computer system interface (SCSI) or a serial attached SCSI (SAS) interface. In other example embodiments, the bus format of the host device may be a USB, a PCIe, an advanced technology attachment (ATA), a parallel ATA (PATA), a SATA, a nonvolatile memory (NVM) express (NVMe), or other format.

The memory interface circuit 150 may exchange data with a nonvolatile memory device (e.g., the nonvolatile memory device 400 in FIG. 6A). The memory interface circuit 150 may transfer data to the nonvolatile memory device 400, and/or may receive data read from the nonvolatile memory device 400. In some example embodiments, the memory interface circuit 150 may be connected to the nonvolatile memory device 400 via one channel. In other example embodiments, the memory interface circuit 150 may be connected to the nonvolatile memory device 400 via two or more channels. The memory interface circuit 150 may be configured to comply with a standard protocol, such as Toggle or open NAND flash interface (ONFI).

The AES engine 180 may perform at least one of an encryption operation and a decryption operation on data input to the storage controller 100 using a symmetric-key algorithm. The AES engine 180 may include an encryption module and a decryption module. For example, the encryption module and the decryption module may be implemented as separate modules. In another example, one module capable of performing both encryption and decryption operations may be implemented in the AES engine 180.

As described above, the nonvolatile memory device 400 may measure the program execution time and/or the erase execution time and provide degeneration information DINF to the storage controller 100, and the degeneration controller 130 in the storage controller 100 may adjust the program voltage VPGM and/or the erase voltage VERS of the nonvolatile memory device 400 based on the degeneration information DINF. In some example embodiments, the degeneration controller 130 may be implemented in the form of hardware or firmware.

Figure 13:
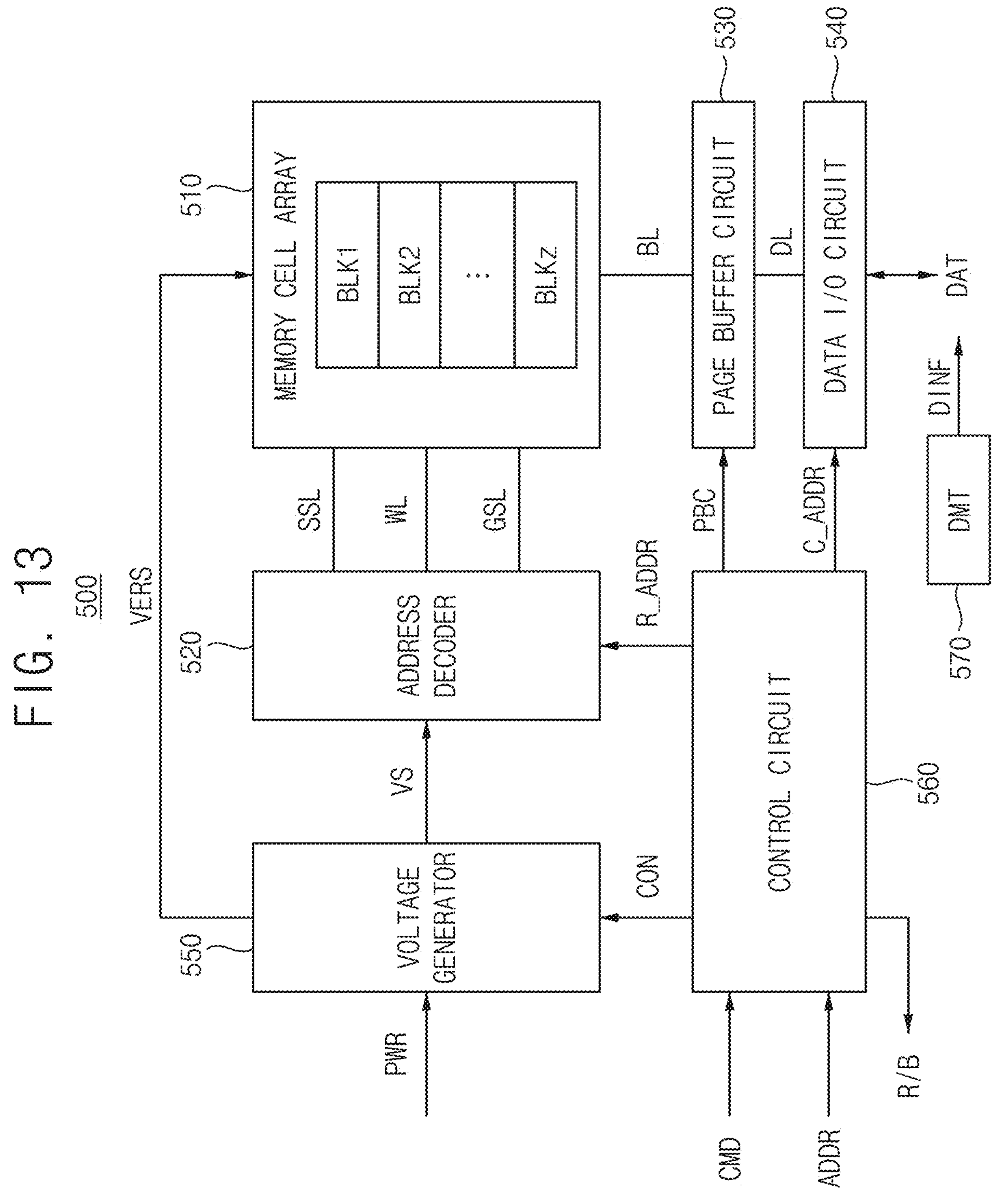
FIG. 13 is a block diagram illustrating a nonvolatile memory device according to example embodiments.

FIG. 13 is a block diagram illustrating a nonvolatile memory device according to example embodiments.

Referring to FIG. 13, a nonvolatile memory 500 includes a memory cell array 510, an address decoder 520, a page buffer circuit 530, a data I/O circuit 540, a voltage generator 550, a control circuit 560 and a degeneration detector DMT 570.

The memory cell array 510 is connected to the address decoder 520 via a plurality of string selection lines SSL, a plurality of wordlines WL and a plurality of ground selection lines GSL. The memory cell array 510 is further connected to the page buffer circuit 530 via a plurality of bitlines BL. The memory cell array 510 may include a plurality of memory cells (e.g., a plurality of nonvolatile memory cells) that are connected to the plurality of wordlines WL and the plurality of bitlines BL. The memory cell array 510 may be divided into a plurality of memory blocks BLK1, BLK2, . . . , BLKz, each of which includes memory cells. In addition, each of the plurality of memory blocks BLK1, BLK2, . . . , BLKz may be divided into a plurality of pages.

In some example embodiments, the plurality of memory cells included in the memory cell array 510 may be arranged in a two-dimensional (2D) array structure or a three-dimensional (3D) vertical array structure. The memory cell array of the 3D vertical array structure will be described below with reference to FIG. 15.

The control circuit 560 receives a command CMD and an address ADDR from an outside (e.g., from the storage controller 100 in FIG. 6A), and controls an erase operation, a write operation and a read operation of the nonvolatile memory 500 based on the command CMD and the address ADDR. The write operation may include performing a sequence of program loops, and the erase operation may include performing a sequence of erase loops. Each program loop may include a program operation and a program verification operation. Each erase loop may include an erase operation and an erase verification operation. The read operation may include a normal read operation and data recover read operation.

For example, the control circuit 560 may generate control signals CON, which are used for controlling the voltage generator 550, and may generate control signal PBC for controlling the page buffer circuit 530, based on the command CMD, and may generate a row address R_ADDR and a column address C_ADDR based on the address ADDR.

The control circuit 560 may provide the row address R_ADDR to the address decoder 520 and may provide the column address C_ADDR to the data I/O circuit 540.

The address decoder 520 may be connected to the memory cell array 510 via the plurality of string selection lines SSL, the plurality of wordlines WL and the plurality of ground selection lines GSL.

For example, in the data erase/write/read operations, the address decoder 520 may determine at least one of the plurality of wordlines WL as a selected wordline, and may determine the remaining wordlines, other than the selected wordline, as unselected wordlines, based on the row address R_ADDR.

In addition, in the data erase/write/read operations, the address decoder 520 may determine at least one of the plurality of string selection lines SSL as a selected string selection line, and may determine the remaining string selection lines, other than the selected string selection line, as unselected string selection lines, based on the row address R_ADDR.

Further, in the data erase/write/read operations, the address decoder 520 may determine at least one of the plurality of ground selection lines GSL as a selected ground selection line, and may determine the remaining ground selection lines, other than the selected ground selection line, as unselected ground selection lines, based on the row address R_ADDR.

The voltage generator 550 may generate voltages VS that are required for an operation of the nonvolatile memory 500 based on a power PWR and the control signals CON. The voltages VS may be applied to the plurality of string selection lines SSL, the plurality of wordlines WL and the plurality of ground selection lines GSL via the address decoder 520. In addition, the voltage generator 550 may generate an erase voltage that is required for the data erase operation based on the power PWR and the control signals CON. The erase voltage may be applied to the memory cell array 510 directly or via the bitline BL.

For example, during the erase operation, the voltage generator 550 may apply the erase voltage to a common source line and/or the bitline BL of a memory block (e.g., a selected memory block) and may apply an erase permission voltage (e.g., a ground voltage) to all wordlines of the memory block or a portion of the wordlines via the address decoder 520. In addition, during the erase verification operation, the voltage generator 550 may apply an erase verification voltage simultaneously to all wordlines of the memory block or sequentially to the wordlines one by one.

For example, during the program operation, the voltage generator 550 may apply a program voltage to the selected wordline and may apply a program pass voltage to the unselected wordlines via the address decoder 520. In addition, during the program verification operation, the voltage generator 550 may apply a program verification voltage to the selected wordline and may apply a verification pass voltage to the unselected wordlines via the address decoder 520.

In addition, during the normal read operation, the voltage generator 550 may apply a read voltage to the selected wordline and may apply a read pass voltage to the unselected wordlines via the address decoder 520. During the data recover read operation, the voltage generator 550 may apply the read voltage to a wordline adjacent to the selected wordline and may apply a recover read voltage to the selected wordline via the address decoder 520.

The page buffer circuit 530 may be connected to the memory cell array 510 via the plurality of bitlines BL. The page buffer circuit 530 may include a plurality of page buffers. In some example embodiments, each page buffer may be connected to one bitline. In other example embodiments, each page buffer may be connected to two or more bitlines.

The page buffer circuit 530 may store data DAT to be programmed into the memory cell array 510 or may read data DAT sensed (i.e., read) from the memory cell array 510. In this regard, the page buffer circuit 530 may operate as a write driver or a sensing amplifier according to an operation mode of the nonvolatile memory 500.

The data I/O circuit 540 may be connected to the page buffer circuit 530 via data lines DL. The data I/O circuit 540 may provide the data DAT from the outside of the nonvolatile memory 500 to the memory cell array 510 via the page buffer circuit 530 or may provide the data DAT from the memory cell array 510 to the outside of the nonvolatile memory 500, based on the column address C_ADDR.

The control circuit 560 activates the state signal R/B to a first logic level indicating a ready state while not performing internal operations for the write operation or the erase operation, and deactivates the state signal R/B to a second logic level indicating a busy state while performing the internal operation. Here, the internal operation may include a voltage application operation of applying the program voltage VPGM or the erase voltage VERS to the memory cell array 510, and a verification operation of applying the program verification voltage or the erase verification voltage to the memory cell array to check the result of the voltage application operation. The state signal R/B may be provided to an external storage controller.

The degeneration detector DMT 570 may generate the deterioration information DINF by measuring at least one of the program execution time required to perform the write operation and the erase execution time required to perform the erase operation. In one example embodiment, the degeneration detector DMT 570 may generate degeneration information DINF based on the state signal R/B.

Although the nonvolatile memory is described based on a NAND flash memory, example embodiments are not limited thereto, and the nonvolatile memory may be any nonvolatile memory, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), or the like.

FIG. 14 is a block diagram illustrating storage device according to example embodiments.

Referring to FIG. 14, a storage device 600 may include a nonvolatile memory device 610 and a storage controller 620. The storage device 600 may support a plurality of channels CH1, CH2, . . . , CHm, and nonvolatile the memory device 610 may be connected to the storage controller 620 through the plurality of channels CH1 to CHm. For example, the storage device 600 may be implemented as a universal flash storage (UFS), a solid state drive (SSD), or the like.

The nonvolatile memory device 610 may include a plurality of nonvolatile memories NVM11, NVM12, . . . , NVM1*n*, NVM21, NVM22, . . . , NVM2*n*, NVMm1, NVMm2, . . . , NVMmn. Each of the nonvolatile memories NVM11 to NVMmn may be connected to one of the plurality of channels CH1 to CHm through a way corresponding thereto. For example, the nonvolatile memories NVM11 to NVM1*n* may be connected to the first channel CH1 through ways W11, W12, . . . , W1*n*, the nonvolatile memories NVM21 to NVM2*n* may be connected to the second channel CH2 through ways W21, W22, . . . , W2*n*, and the nonvolatile memories NVMm1 to NVMmn may be connected to the m-th channel CHm through ways Wm1, Wm2, . . . , Wmn. In some example embodiments, each of the nonvolatile memories NVM11 to NVMmn may be implemented as a memory unit that may operate according to an individual command from the storage controller 620. For example, each of the nonvolatile memories NVM11 to NVMmn may be implemented as a chip or a die, but example embodiments are not limited thereto.

The storage controller 620 may transmit and receive signals to and from the nonvolatile memory device 610 through the plurality of channels CH1 to CHm. For example, the storage controller 620 may transmit commands CMDa, CMDb, . . . , CMDm, addresses ADDRa, ADDRb, . . . , ADDRm and data DATAa, DATAb, . . . , DATAm to the nonvolatile memory device 610 through the channels CH1 to CHm, or may receive the data DATAa to DATAm from the nonvolatile memory device 610 through the channels CH1 to CHm.

The storage controller 620 may select one of the nonvolatile memories NVM11 to NVMmn, which is connected to each of the channels CH1 to CHm, using a corresponding one of the channels CH1 to CHm, and may transmit and receive signals to and from the selected nonvolatile memory. For example, the storage controller 620 may select the nonvolatile memory NVM11 from among the nonvolatile memories NVM11 to NVM1*n* connected to the first channel CH1. The storage controller 620 may transmit the command CMDa, the address ADDRa and the data DATAa to the selected nonvolatile memory NVM11 through the first channel CH1 or may receive the data DATAa from the selected nonvolatile memory NVM11 through the first channel CH1.

The storage controller 620 may transmit and receive signals to and from the nonvolatile memory device 610 in parallel through different channels. For example, the storage controller 620 may transmit the command CMDb to the nonvolatile memory device 610 through the second channel CH2 while transmitting the command CMDa to the nonvolatile memory device 610 through the first channel CH1. For example, the storage controller 620 may receive the data DATAb from the nonvolatile memory device 610 through the second channel CH2 while receiving the data DATAa from the nonvolatile memory device 610 through the first channel CH1.

The storage controller 620 may control overall operations of the nonvolatile memory device 610. The storage controller 620 may transmit a signal to the channels CH1 to CHm and may control each of the nonvolatile memories NVM11 to NVMmn connected to the channels CH1 to CHm. For example, the storage controller 620 may transmit the command CMDa and the address ADDRa to the first channel CH1 and may control one selected from among the nonvolatile memories NVM11 to NVM1*n*.

Each of the nonvolatile memories NVM11 to NVMmn may operate under the control of the storage controller 620. For example, the nonvolatile memory NVM11 may program the data DATAa based on the command CMDa, the address ADDRa and the data DATAa provided from the storage controller 620 through the first channel CH1. For example, the nonvolatile memory NVM21 may read the data DATAb based on the command CMDb and the address ADDRb provided from the storage controller 620 through the second channel CH2 and may transmit the read data DATAb to the storage controller 620 through the second channel CH2.

Although FIG. 14 illustrates an example where the nonvolatile memory device 610 communicates with the storage controller 620 through m channels and includes n nonvolatile memories corresponding to each of the channels, example embodiments are not limited thereto and the number of channels and the number of nonvolatile memories connected to one channel may be variously changed.

Figure 15:
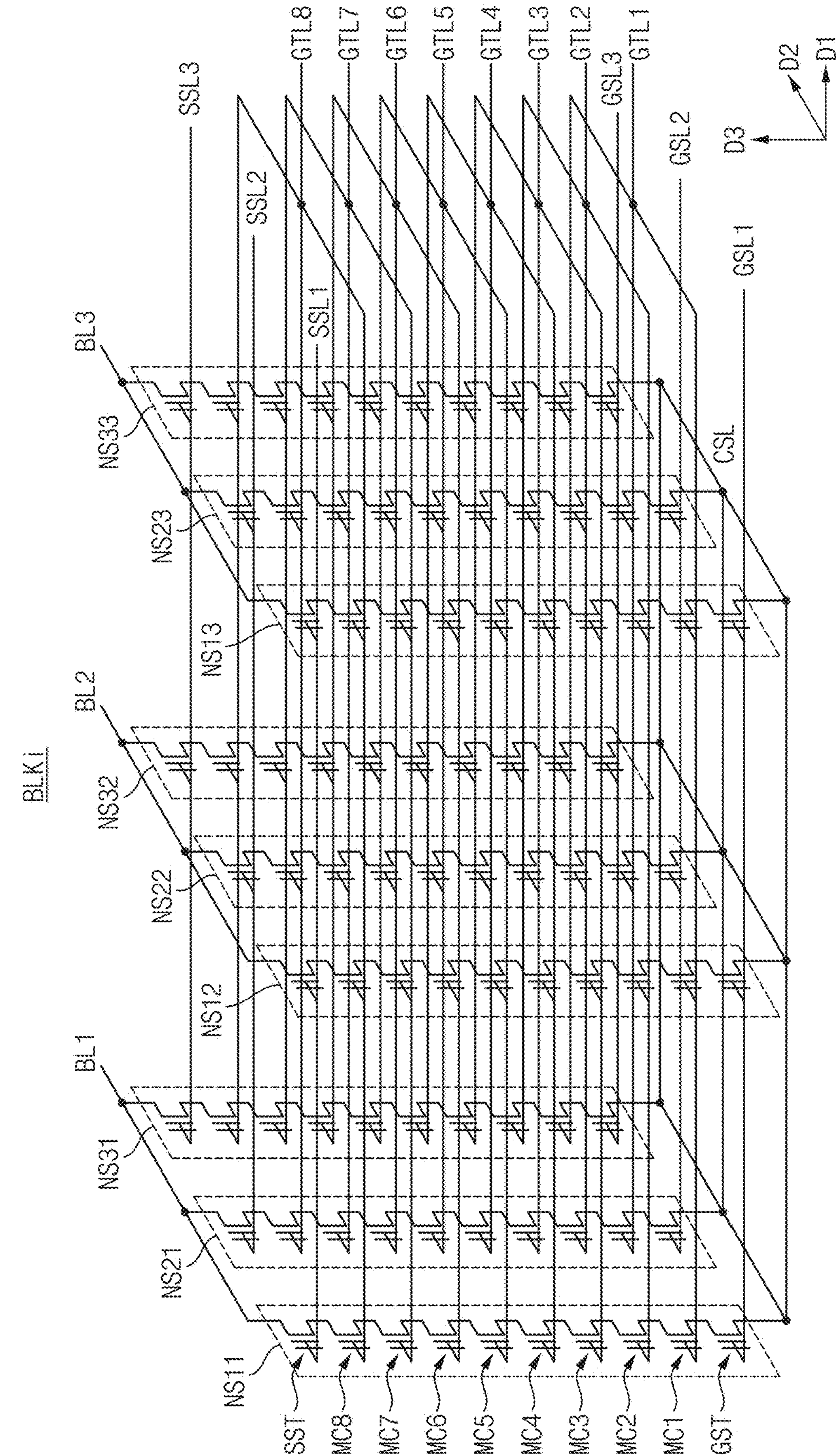
FIG. 15 is a circuit diagram illustrating an equivalent circuit of a memory block included in a nonvolatile memory device according to example embodiments.

FIG. 15 is a circuit diagram illustrating an equivalent circuit of a memory block included in a nonvolatile memory device according to example embodiments.

Referring to FIG. 15, each memory block BLKi included in a memory cell array may be formed on a substrate in a three-dimensional structure (or a vertical structure). For example, NAND strings or cell strings included in the memory block BLKi may be formed in a vertical direction D3 perpendicular to an upper surface of a substrate. A first direction D1 and a second direction D2 are parallel to the upper surface of the substrate.

The memory block BLKi may include NAND strings NS11 to NS33 coupled between bitlines BL1, BL2, and BL3 and a common source line CSL. Each of the NAND strings NS11 to NS33 may include a string selection transistor SST, a memory cells MC1 to MC8, and a ground selection transistor GST. In FIG. 15, each of the NAND strings NS11 to NS33 is illustrated to include eight memory cells MC1 to MC8. However, example embodiments are not limited thereto, and each of the NAND strings NS11 to NS33 may include various numbers of memory cells.

Each string selection transistor SST may be connected to a corresponding string selection line (one of SSL1 to SSL3). The memory cells MC1 to MC8 may be connected to corresponding gate lines GTL1 to GTL8, respectively. The gate lines GTL1 to GTL8 may be wordlines, and some of the gate lines GTL1 to GTL8 may be dummy wordlines. Each ground selection transistor GST may be connected to a corresponding ground selection line (one of GSL1 to GSL3). Each string selection transistor SST may be connected to a corresponding bitline (e.g., one of BL1, BL2, and BL3), and each ground selection transistor GST may be connected to the common source line CSL.

Wordlines (e.g., WL1) having the same height may be commonly connected, the ground selection lines GSL1 to GSL3 may be separated, and the string selection lines SSL1 to SSL3 may be separated. In FIG. 15, the memory block BLKi is illustrated as being coupled to eight gate lines GTL1 to GTL8 and three bitlines BL1 to BL3. However, example embodiments are not limited thereto, and each memory block in the memory cell array 510 may be coupled to various numbers of wordlines and various numbers of bitlines.

Figure 16:
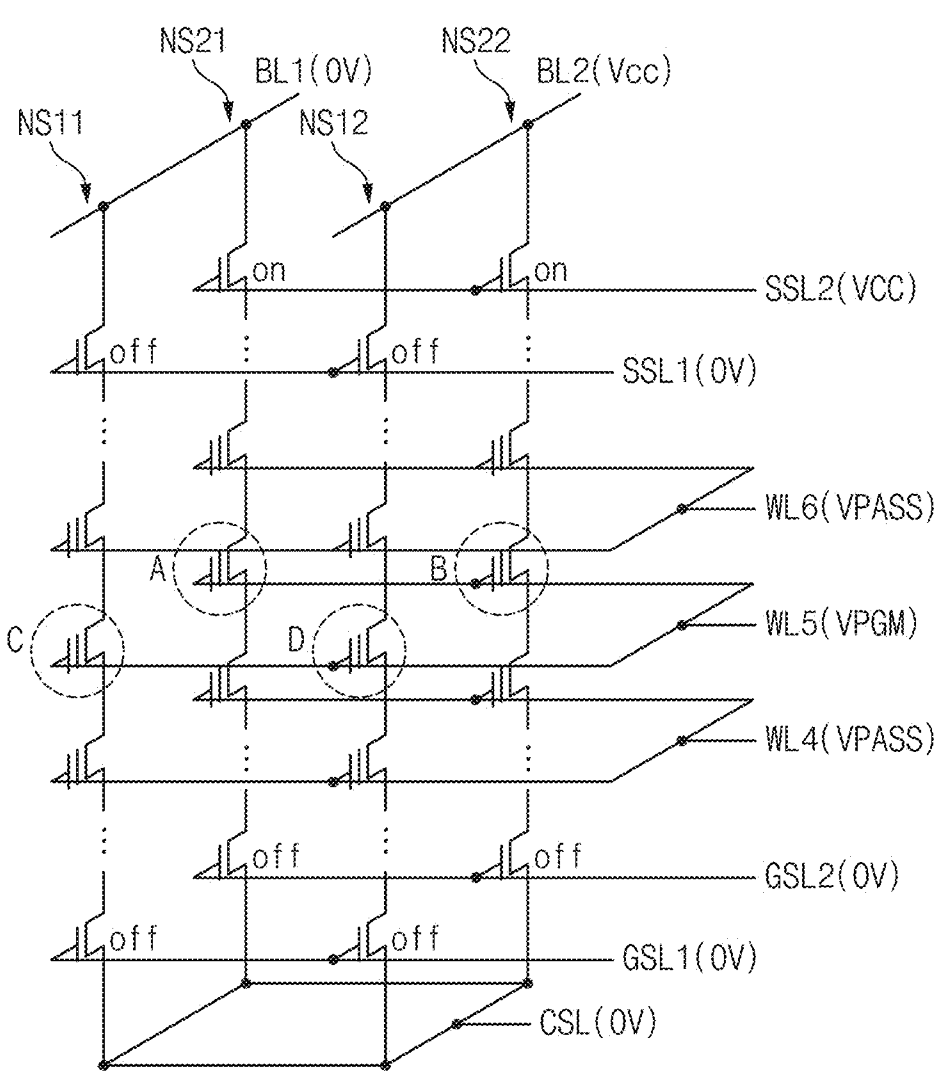
FIG. 16 is a circuit diagram illustrating a program bias condition of a nonvolatile memory device according to example embodiments.

FIG. 16 is a circuit diagram illustrating a program bias condition of a nonvolatile memory device according to example embodiments.

For convenience of description, NAND strings NS11 and NS21 connected to a first bitline BL1 and NAND strings NS12 and NS22 connected to a second bitline BL2 are illustrated in FIG. 16.

The first bitline BL1 may be a program bitline to which a program permission voltage (e.g., 0 V) is applied, and the second bitline BL2 may be a program inhibition bitline to which a program inhibition voltage such as a power supply voltage VCC is applied. If the NAND string NS21 among the NAND strings NS11 and NS21 is selected, during a program operation, a voltage of 0 V may be applied to a first string selection line SSL1, and the power supply voltage VCC may be applied to a second string selection line SSL2.

The voltage of 0 V may be applied to ground selection lines GSL1 and GSL2. Furthermore, a voltage (e.g., VCC) higher than 0 V may be applied to a common source line CSL. A program voltage VPGM (e.g., 18 V) may be applied to a selected wordline (e.g., WL5) and a pass voltage VPASS (e.g., 8 V) may be applied to unselected wordlines (e.g., WL4 and WL6).

Under the program bias condition, the program voltage VPGM of 18V may be applied to a gate of a memory cell A having a channel voltage of 0 V. Because a strong electric field is formed between the gate and a channel of the memory cell A, the memory cell A may be programmed. However, because respective channels of memory cells C and D are in a floating state, channel voltages thereof may be boosted up to, for example, about 8 V, and thus, the memory cells C and D may not be programmed. The memory cell B may not be programmed because a weak electric field is formed between the gate of the memory cell B and the channel. The voltage generator 550 in FIG. 13 may generate the program voltage VPGM and the program pass voltage VPASS applied to the plurality of wordlines during the program operation.

Figure 17:
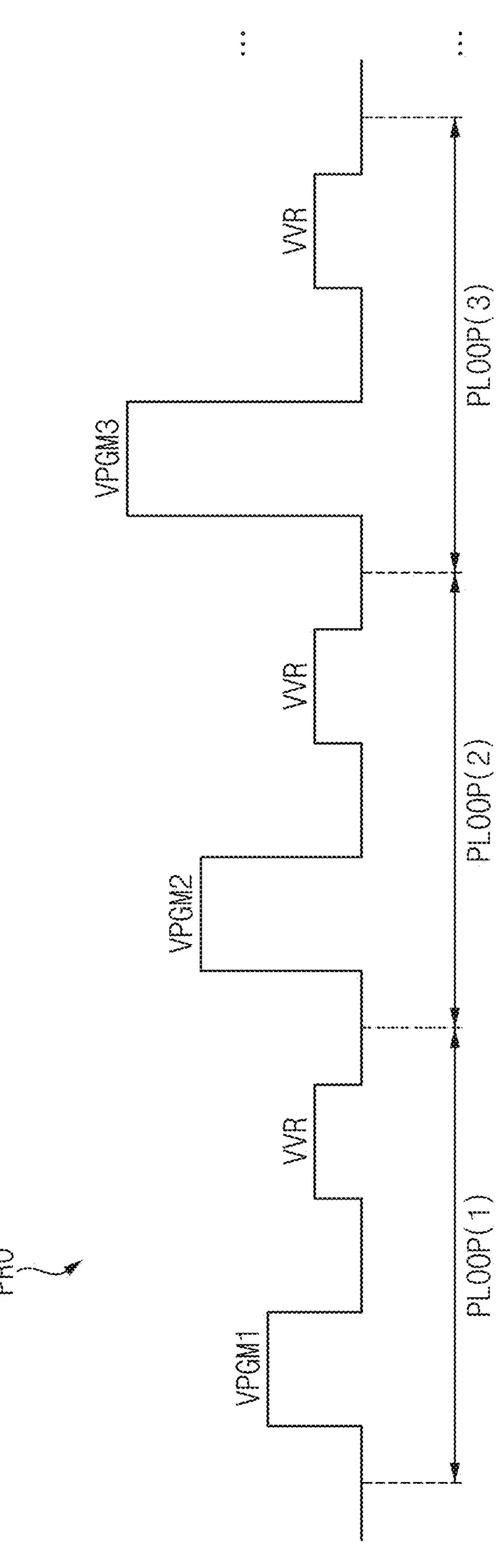
FIGS. 17 and 18 are diagrams illustrating incremental step pulse programming (ISPP) of a nonvolatile memory device according to example embodiments.
Figure 18:
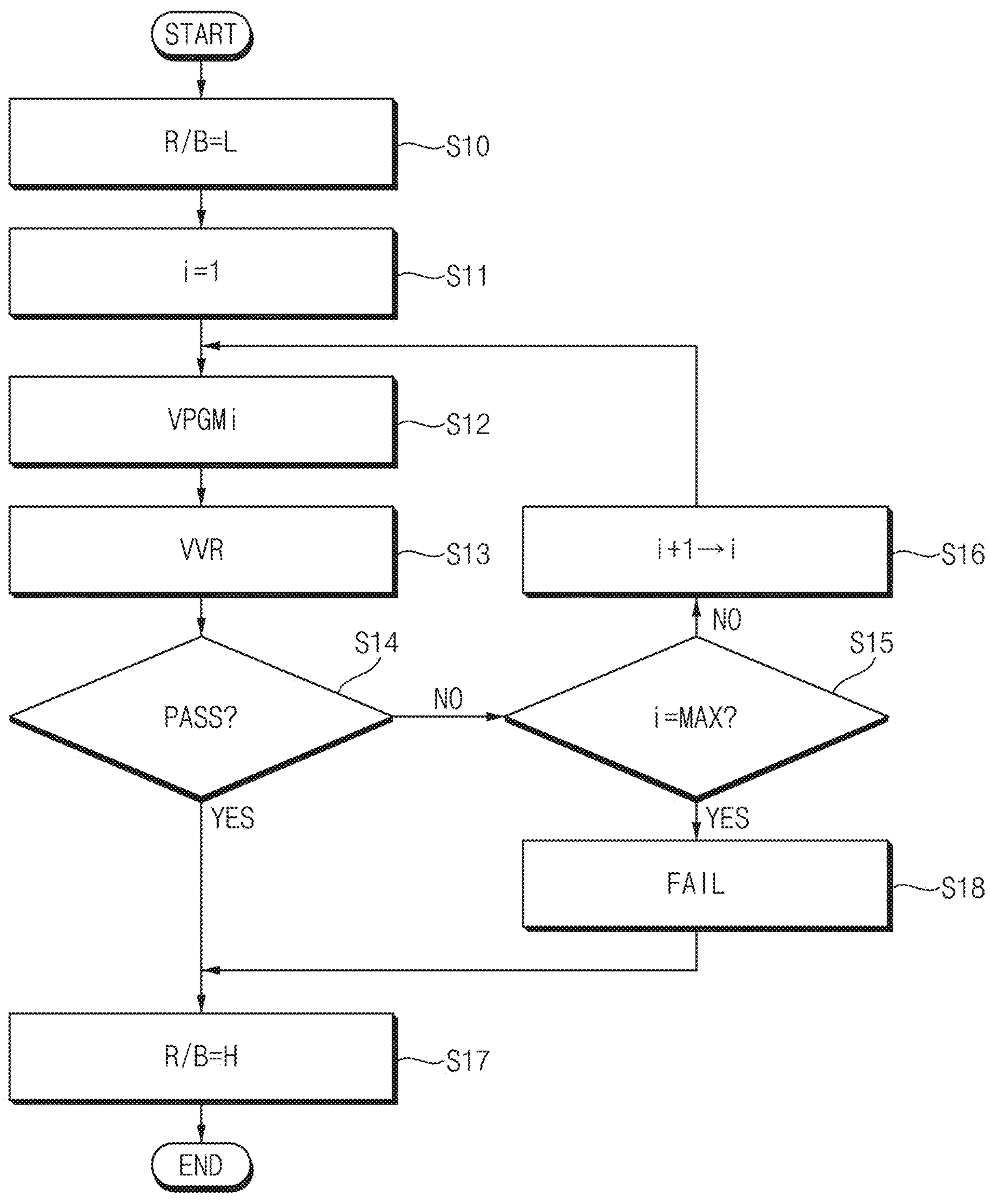

FIGS. 17 and 18 are diagrams illustrating incremental step pulse programming (ISPP) of a nonvolatile memory device according to example embodiments.

Referring to FIGS. 17 and 18, in accordance with ISPP, a program operation PRO may be performed by sequentially executing a plurality of program loops PLOOP(1), PLOOP(2), PLOOP(3), . . . until the data programming is completed. As the program loop is repeated, the program voltages VPGM1, VPGM2, VPGM3, . . . may be increased step by step.

Each program loop PLOOP(i) may include a program period and a verification period. During the program period, program execution operations may be performed to apply program voltages VPGM1, VPGM2, VPGM3, . . . to the selected wordlines to program the selected memory cells. Subsequently, a program verification operation may be performed that applies a program verification output voltage VVR to the selected wordline to verify the success of the program during the verification period.

Referring to FIGS. 13 and 18, when the write data is stored in the page buffer circuit 530 and the nonvolatile memory 500 is ready to perform internal operations for programming the write data, the control circuit 560 may deactivate the state signal R/B to a second logic level (e.g., logic low level L) (S10).

The control circuit 560 may initialize the loop number (i) to 1 such that the first program loop PLOOP(1) may be performed (S11), apply a program voltage VPGMi corresponding to the i-th program loop to the selected wordline (S12), and then apply a program verification output voltage VVR to the selected wordline (S13). The control circuit 560 may determine whether a pass condition is satisfied (S14).

If the pass condition is satisfied (S14: YES), the control circuit 560 may activate the state signal R/B to the first logic level (e.g., logic high level H) and terminate internal operations for the program.

If the pass condition is not satisfied (S14: NO), the control circuit 560 may determine whether the loop number i reaches a maximum value MAX (S15). If the loop number i has not reached the maximum value MAX (S15: NO), the control circuit 560 may increment the loop number i by one (S16) and repeat the program execution operation S12 and the program verification operation S13 based on the increased program voltage VPGMi until the loop number i reaches a maximum value MAX.

If the pass condition is not satisfied (S14: NO, S15: YES) after performing the program loops by the maximum number of times MAX, the control circuit 560 may treat the program for the selected wordline as FAIL (S18), activate the state signal R/B to the first logic level H, and terminate the internal operations for the program.

In this way, the above program execution operation and the above program verification operation may be repeatedly performed while increasing the program voltage VPGM1, VPGM2, VPGM3, . . . step by step until the pass condition is satisfied or the loop number i reaches a maximum value MAX. Here, the pass condition indicates a maximum allowable number of unprogrammed memory cells whose threshold voltage is lower than the program verification voltage VVR among the selected memory cells to be programmed, and the program loop may be repeated until the number of unprogrammed memory cells is less than the maximum allowable number. The maximum allowable number may be determined based on the ECC level of the nonvolatile memory device.

Figure 19:
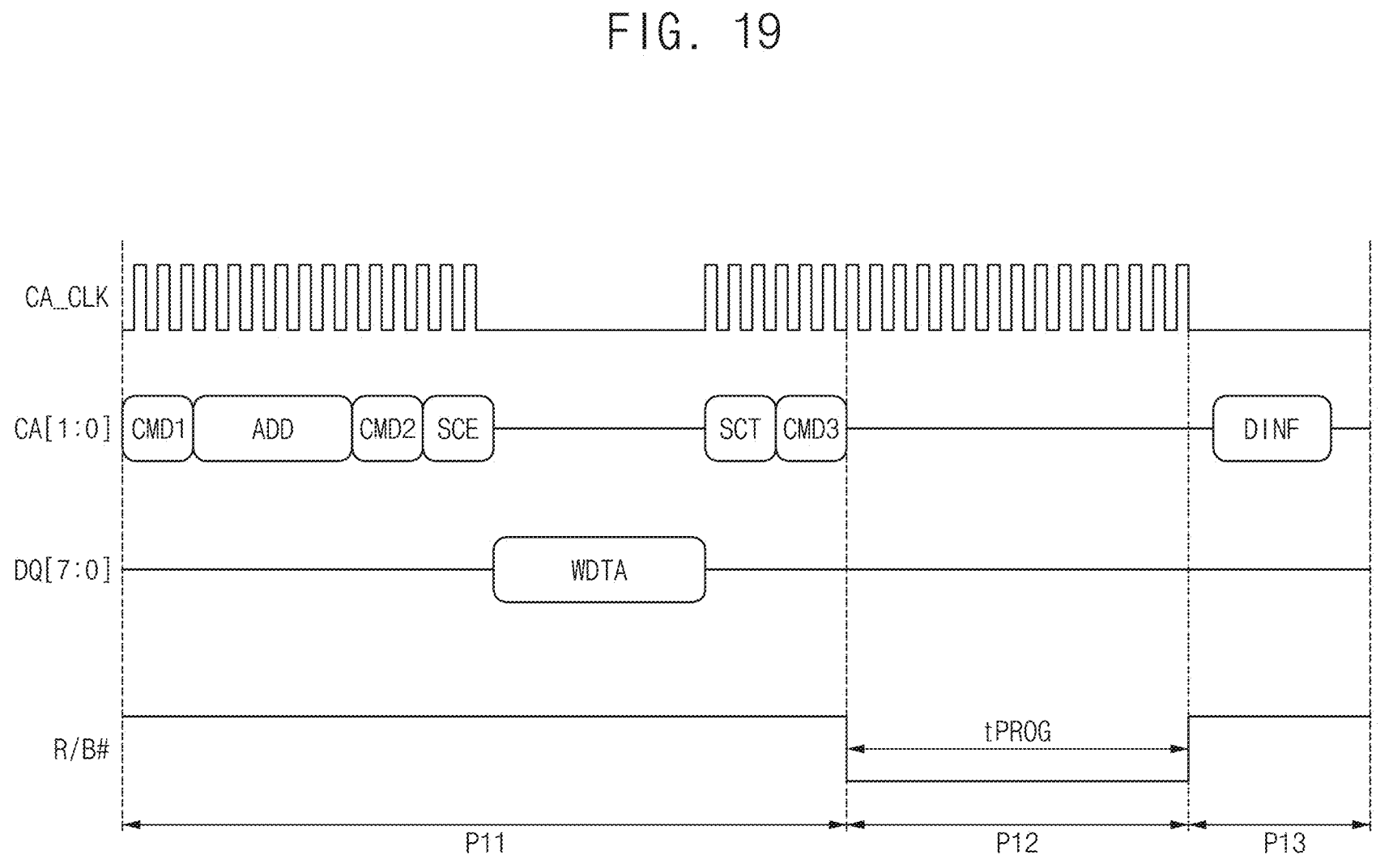

FIG. 19 is a timing diagram illustrating an example embodiment of a write operation of a nonvolatile memory device according to example embodiments.

Referring to FIG. 19, in a first operation period P11, the nonvolatile memory device may sequentially receive commands CMD1, CMD2, SCE, SCT and CMD3, and an address ADD via command-address signals CA[1] and CA[0]. In addition, the nonvolatile memory device may receive write data WDTA via data signals DQ[7:0] with the commands SCE and SCT indicating transfer and termination of the data.

In a second operation period P12, the nonvolatile memory device may perform internal operations including applying a program voltage and verifying success of applying the program voltage in order to program the received write data WDTA. The nonvolatile memory device may deactivate the state signal R/B to a second logic level while performing the internal operations. The start of the program execution time tPROG corresponds to the time when the state signal R/B transitions to the logic low level indicating the BUSY state of the nonvolatile memory device, at which time the clock cycle of the command-address clock signal CA_CLK begins. The end of the program execution time tPROG corresponds to the transition of the state signal R/B to the logic high level indicating the READY state of the nonvolatile memory device, at which time the clock cycle of the command-address clock signal CA_CLK ends.

In a third operation period P23, the measured clock cycle value is transmitted from the nonvolatile memory device to the storage controller as the degeneration information DINF. The measured clock cycle value of the command-address clock signal CA_CLK indicates the program execution time tPROG during the actual program operation of the nonvolatile memory device.

The degeneration detector DMT 570 of FIG. 13 may generate the degeneration information DINF based on such state signal R/B, that is, the degeneration detector DMT 570 may measure the program execution time tPROG based on the time interval while the state signal R/B is deactivated to the second logic level during the write operation.

As described above with reference to FIG. 9, the nonvolatile memory device may receive commands and addresses in synchronization with the command-address clock signal CA_CLK provided by the storage controller. In this case, the degeneration detector DMT may measure the program execution time tPROG by counting the number of cycles of the command-address clock signal CA_CLK while the state signal R/B is deactivated to the second logic level during the write operation. For counting the number of cycles, the degeneration detector DMT may include a counter with the command-address clock signal CA_CLK and the state signal R/B as inputs. The storage controller may continue to toggle the command-address clock signal CA_CLK while the state signal R/B is deactivated to the second logic level.

The program execution time tPROG may be substantially proportional to the number of executions of the program loops described with reference to FIGS. 17 and 18. In one example embodiment, the degeneration detector DMT may measure the program execution time tPROG based on the number of program loops executed until the write operation is completed, i.e., until the pass condition is satisfied.

Figure 20:
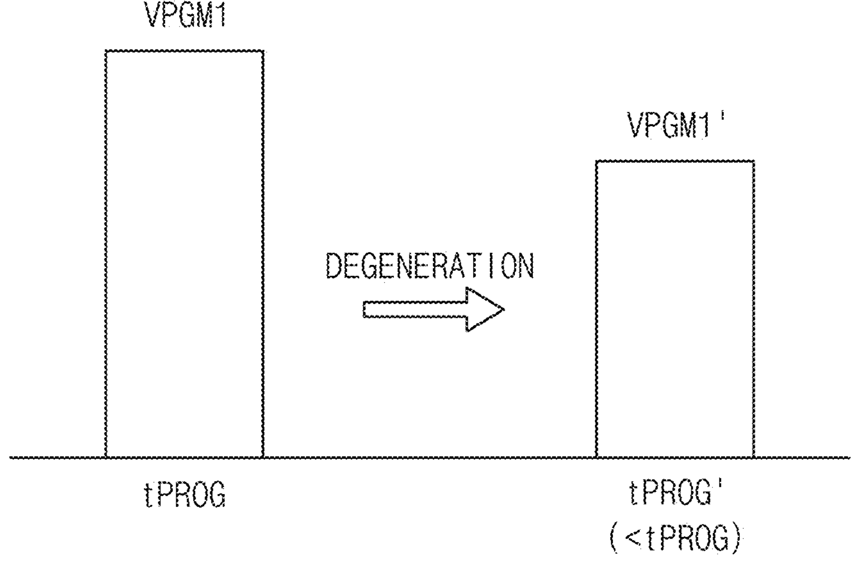
FIG. 20 is a diagram illustrating an example embodiment of adjusting a program voltage of a storage device according to example embodiments.

FIG. 20 is a diagram illustrating an example embodiment of adjusting a program voltage of a storage device according to example embodiments.

FIG. 20 shows program voltages VPGM1 and VPGM1' of a first program loop PLOOP(1) corresponding to measured program execution times tPROG and tPROG', respectively. As described with reference to FIG. 2, as the degeneration of the memory cells progresses, the program execution time decreases. In this regard, the program execution time tPROG' for a relatively large degeneration is less than the program execution time tPROG for a relatively small degeneration. The storage controller may control the program voltages VPGM1 and VPGM1' of the first program loop PLOOP(1) such that the program voltage VPGM1' corresponding to the relatively small program execution time tPROG' is lower than the program voltage VPGMI corresponding to the relatively large program execution time tPROG. In this way, the storage controller may control the nonvolatile memory device such that the program voltage decreases as the degree of degeneration of the nonvolatile memory device increases based on degeneration information DINF indicating the program execution time.

Figure 21:
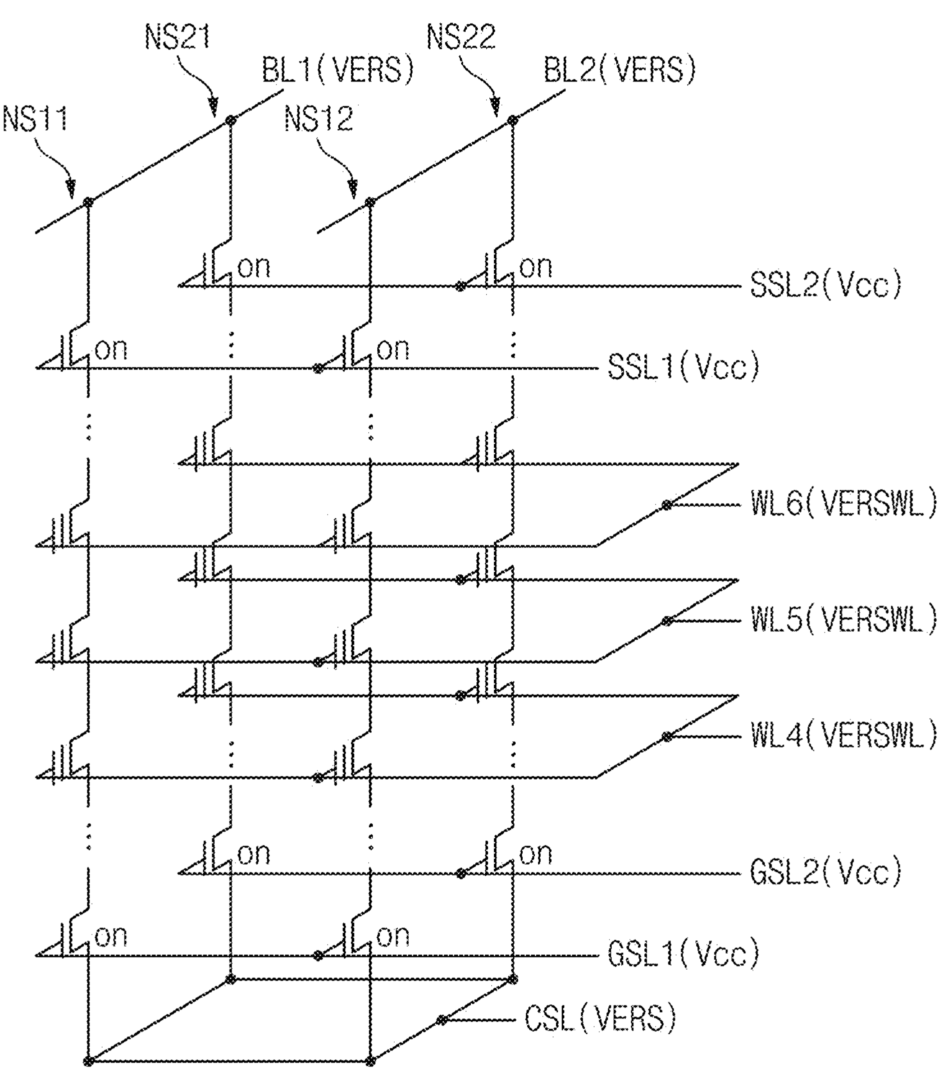
FIG. 21 is a circuit diagram illustrating an erase bias condition of a nonvolatile memory device according to example embodiments.

FIG. 21 is a circuit diagram illustrating an erase bias condition of a nonvolatile memory device according to example embodiments.

For convenience of description, NAND strings NS11 and NS21 connected to a first bitline BL1 and NAND strings NS12 and NS22 connected to a second bitline BL2 are illustrated in FIG. 21.

During an erase operation, an erase voltage VERS may be applied to the first bitline BL1 and the second bitline BL2. In this case, the power supply voltage VCC, for example, is applied to the first string selection line SSL1 and the second string selection line SSL2. Also, during the erase operation, the erase voltage VERS may be applied to the common source line CSL. In this case, the power supply voltage VCC may be applied to the first ground selection line GSL1 and the second ground selection line GSL2. The erase enable voltage VERSWL may be applied to the wordlines WL4, WL5 and WL6.

Under this erase bias condition, voltages of the drain and source of the memory cells of the memory block may be, for example, 20V, and a voltage of, for example, 0V may be applied to the gate. The voltage generator 860 of FIG. 6 may generate the erase voltage VERS applied to the bitlines BL1 and BL2 and/or the common source line CSL during the erase operation.

Figure 22:
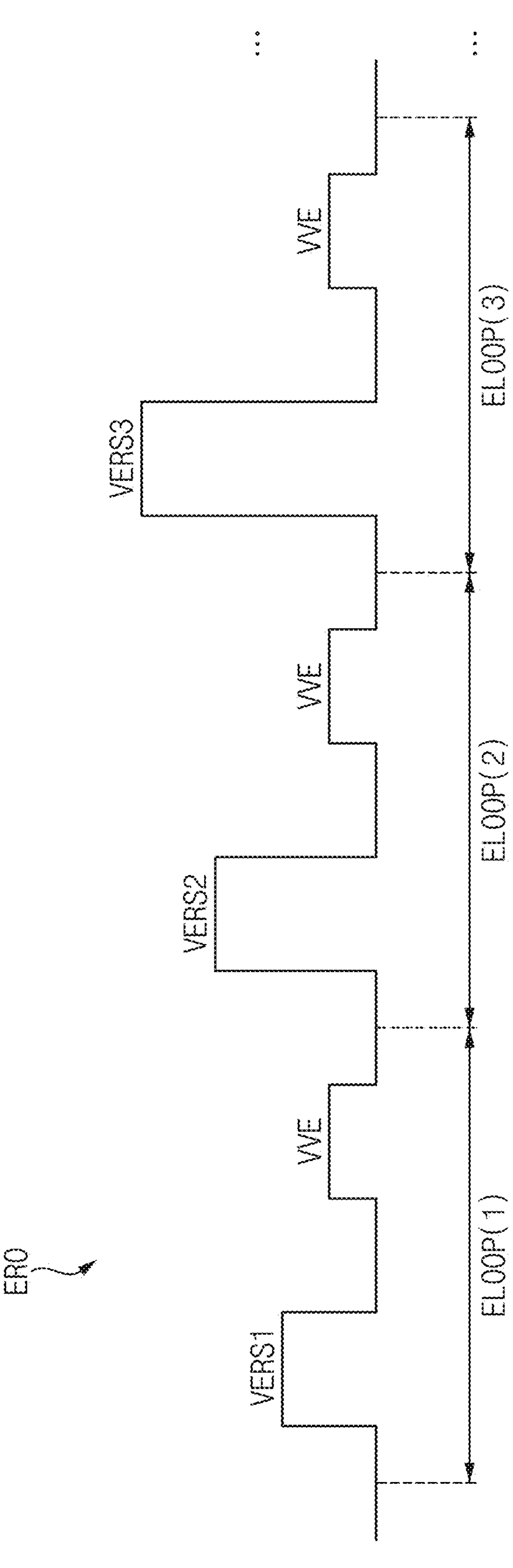
FIGS. 22 and 23 are diagrams illustrating incremental step pulse erasing (ISPE) of a nonvolatile memory device according to example embodiments.
Figure 23:
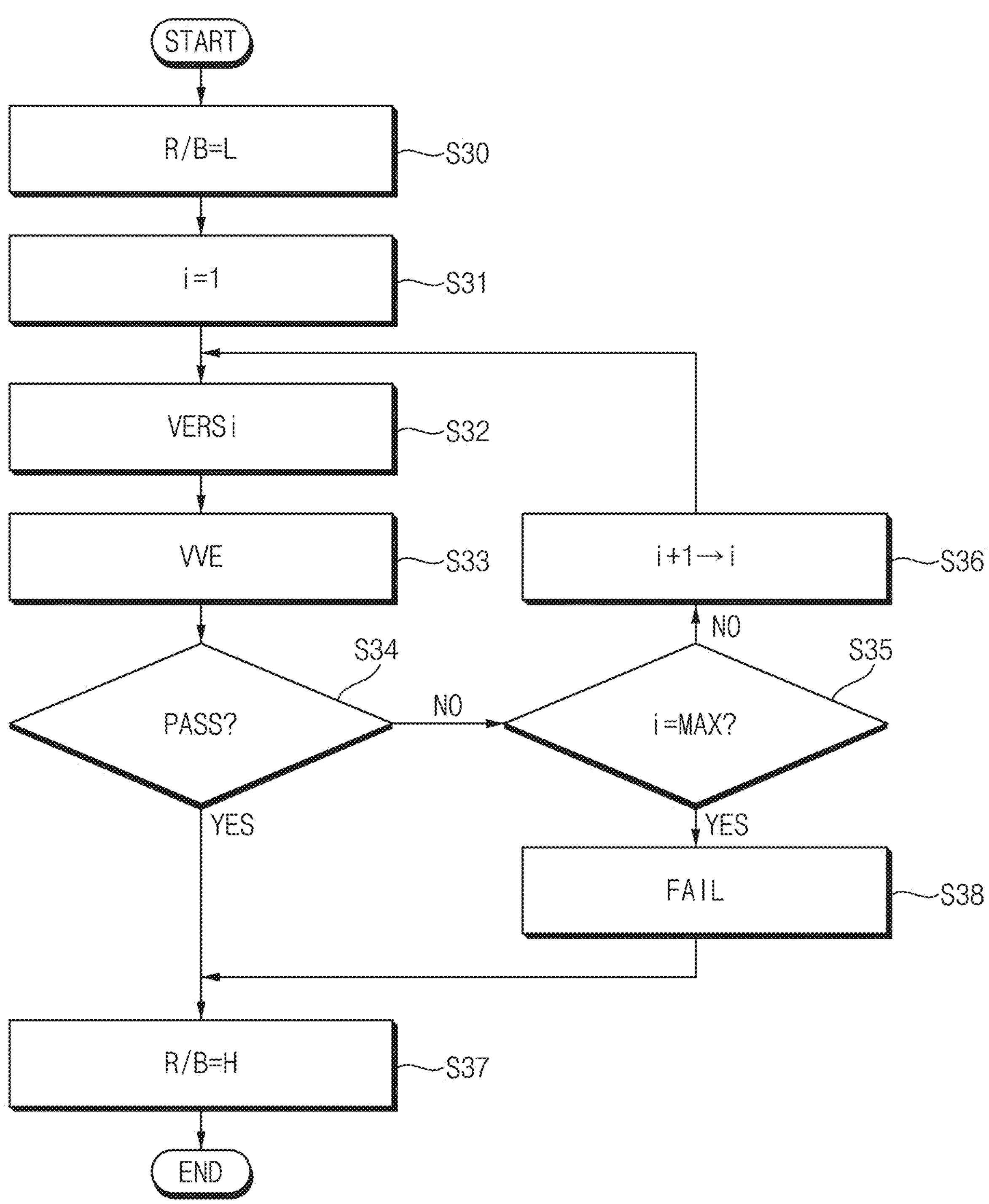

FIGS. 22 and 23 are diagrams illustrating incremental step pulse erasing (ISPE) of a nonvolatile memory device according to example embodiments.

Referring to FIGS. 22 and 23, according to ISPE, an erase operation ERO may be performed by sequentially performing a plurality of erase loops ELOOP(1), ELOOP(2), ELOOP(3), . . . until the erasure of the memory cells is complete. As the erase loop is repeated, the erase voltages VERS1, VERS2, VERS3, . . . may be increased step by step.

Each erase loop ELOOP(i) may include an erase period and a verification period. During the erase period, an erase execution operation may be performed to apply the erase voltages VERS1, VERS2, VERS3, . . . to the bitlines and/or source lines to erase the memory cells. Subsequently, an erase verification operation may be performed to apply an erase verification output voltage VVE to the selected wordline to verify the success of the erase operation during the verification period.

Referring to FIGS. 13 and 23, when ready to perform the internal operations for the erase operation, the control circuit 560 may deactivate the state signal R/B to a second logic level (e.g., logic low level L) (S30).

The control circuit 560 may initialize the loop number (i) to 1 such that the first erase loop ELOOP(1) is performed (S21), apply an erase voltage VERSi corresponding to the i-th erase loop to the bitline and/or source line (S22), and subsequently apply an erase verification output voltage VVE to the selected wordline (S33). The control circuit 560 may determine whether a pass condition is satisfied (S34).

If the pass condition is satisfied (S34: YES), the control circuit 560 may activate the state signal R/B to a first logic level (e.g., logic high level H) and terminate internal operations for the erase operation.

If the pass condition is not satisfied (S34: NO), the control circuit 560 may determine whether the loop number i reaches a maximum value MAX (S35). If the loop number i has not reached the maximum value MAX (S35: NO), the control circuit 560 may increment the loop number i by one (S36) and repeat the erase execution operation S32 and the erase verification operation based on the increased erase voltage VERSi (S33) until the pass condition is satisfied (S34: YES) or the loop number i reaches a maximum value MAX (S35: NO).

If the pass condition is not satisfied (S34: NO, S35: YES) after performing the erase loop by the maximum number of times MAX, the control circuit 560 may treat the erase of the memory cells as FAIL (S38), activate the state signal R/B to the first logic level H, and terminate the internal operation for erasing.

In this way, the above erase execution operation and the above erase verification operation may be repeatedly performed while stepwise increasing the erase voltage VERS1, VERS2, VERS3, . . . until the pass condition is satisfied or the loop number i reaches a maximum value MAX. Here, the pass condition indicates a maximum allowable number of unerased memory cells whose threshold voltage is higher than the erase verification voltage VVE among the selected memory cells to be erased, and the erase loop may be repeated until the number of unerased memory cells is less than the maximum allowable number. The maximum allowable number may be determined based on the ECC level of the nonvolatile memory device.

Figure 24:
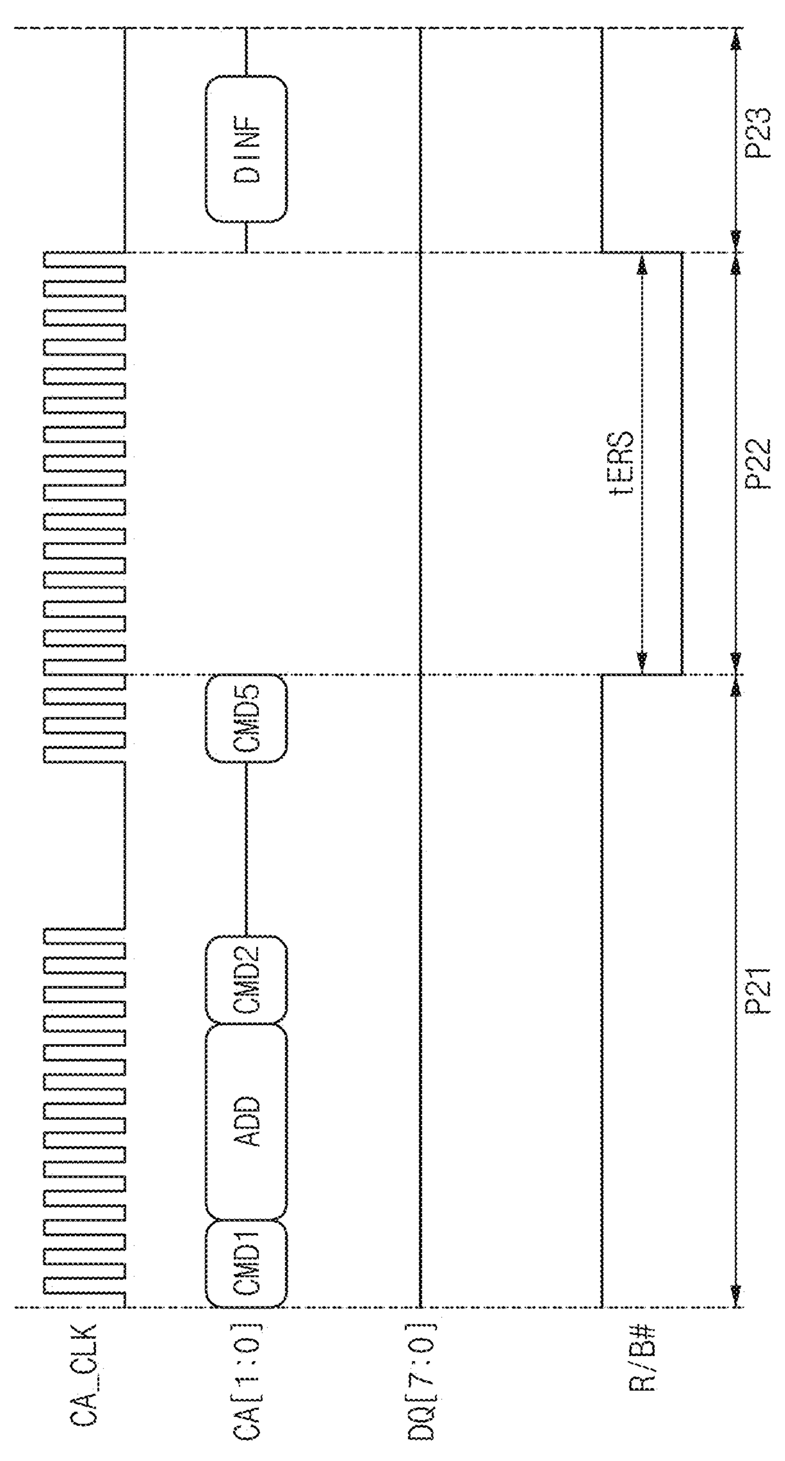
FIG. 24 is a timing diagram illustrating an example embodiment of an erase operation of a nonvolatile memory device according to example embodiments.

FIG. 24 is a timing diagram illustrating an example embodiment of an erase operation of a nonvolatile memory device according to example embodiments.

Referring to FIG. 24, in a first operation period P21, the nonvolatile memory device may sequentially receive commands CMD1, CMD2 and CMD5 and an address ADD via command-address signals CA[1] and CA[0].

In a second operation period P22, the nonvolatile memory device may perform internal operations to erase the memory cells, including applying an erase voltage and verifying the erasure. The nonvolatile memory device may deactivate the state signal R/B to a second logic level while performing the internal operation. The start of the erase execution time tERS corresponds to the time when the state signal R/B transitions to the logic low level indicating the BUSY state of the nonvolatile memory device, at which time the clock cycle of the command-address clock signal CA_CLK begins. The end of the erase execution time tERS corresponds to the transition of the state signal R/B to the logic high level indicating the READY state of the nonvolatile memory device, at which time the clock cycle of the command-address clock signal CA_CLK ends.

In a third operation period P23, the measured clock cycle value is transmitted from the nonvolatile memory device to the storage controller as the degeneration information DINF. The measured clock cycle value of the command-address clock signal CA_CLK indicates the erase execution time tERS during the actual erase operation of the nonvolatile memory device.

The degeneration detector DMT 570 of FIG. 13 may generate the degeneration information DINF based on such state signal R/B, that is, the degeneration detector DMT 570 may measure the erase execution time tERS based on the time interval while the state signal R/B is deactivated to the second logic level during the erase operation.

As described above with reference to FIG. 9, the nonvolatile memory device may receive commands and addresses in synchronization with the command-address clock signal CA_CLK provided by the storage controller. In this case, the degeneration detector DMT 570 may measure the program execution time tPROG by counting the number of cycles of the command-address clock signal CA_CLK while the state signal R/B is deactivated to the second logic level in the erase operation. For counting the number of cycles, the degeneration detector DMT 570 may include a counter with the command-address clock signal CA_CLK and the state signal R/B as inputs. The storage controller may continue to toggle the command-address clock signal CA_CLK while the state signal R/B is deactivated to the second logic level.

The erase execution time tERS may be substantially proportional to the number of executions of the erase loops described with reference to FIGS. 22 and 23. In one example embodiment, the degeneration detector DMT 570 may measure the erase execution time tERS based on the number of erase loops executed until the erase operation is complete, i.e., until the pass condition is satisfied.

Figures 25, 26:
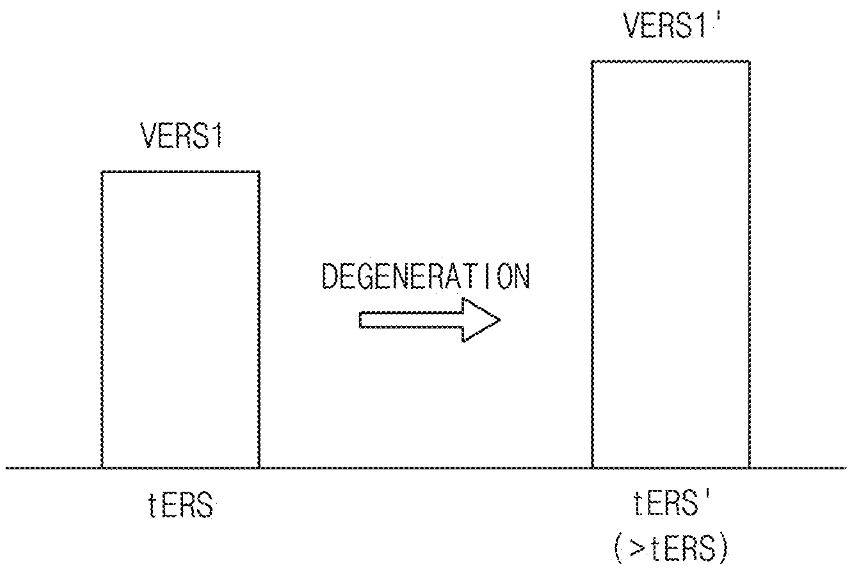

FIG. 25 is a diagram illustrating an example embodiment of adjusting an erase voltage of a storage device according to example embodiments.

In FIG. 25, erase voltages VERS1 and VERS1' of a first erase loop ELOOP(1) corresponding to measured erase execution times tERS and tERS' are shown, respectively. As described with reference to FIG. 4, the erase execution time increases as the degeneration of the memory cells progresses. In this regard, the erase execution time tERS' for relatively large degeneration is larger than the erase execution time tERS for relatively small degeneration. The storage controller may control the erase voltages VERS1 and VERS1' of the first erase loop ELOOP(1) such that the erase voltage VERS1' corresponding to the relatively large erase execution time tERS' is higher than the erase voltage VERSI corresponding to the relatively small program execution time tERS. In this way, the storage controller may control the nonvolatile memory device such that the erase voltage increases as the degree of degeneration of the nonvolatile memory device increases based on degeneration information DINF indicating the erase execution time.

FIGS. 26 and 27 are diagrams illustrating example embodiment of degeneration information in a method of operating a storage device according to example embodiments.

In one example embodiment, as shown in FIG. 26, count values CNT1, CNT2, and CNT3 corresponding to memory blocks BLK1, BLK2, and BLK3, respectively, may be generated and managed as degeneration information DINF. The count values CNT1, CNT2 and CNT3 may be values obtained by counting the number of cycles of the command-address clock signal CA_CLK while the state signal R/B is deactivated to the second logic level, as described above.

In one example embodiment, the program execution time tPROG may be measured for all of the wordlines of each memory block to control the program voltage VPGM on a per-wordline basis. Further, the program voltage VPGM of each memory block may be controlled based on an average value of the measured program execution times tPROG of the wordlines of each memory block.

In one example embodiment, at least one target wordline among the wordlines of each memory block may be set and the program execution time tPROG for the target wordline may be measured and applied as degeneration information DINF for the entire memory block. For example, the target wordline may correspond to the wordline associated with the memory cells with the worst degeneration characteristics. The target wordline may be established through the testing process of the nonvolatile memory device.

In another example embodiment, as shown in FIG. 27, the memory blocks BLK1 and BLK2 may be divided into a first sub-block SB1 containing some wordlines WL0 through WLk and a second sub-block SB2 containing other wordlines WLk+1 through WLn, and count values corresponding to degeneration information DINF may be generated and managed on a sub-block-by-sub-block basis. The first sub-block SB1 and the second sub-block SB2 may each be subject to an erase operation independently. In accordance with example embodiments, each memory block may be divided into three or more sub-blocks.

Figure 28:
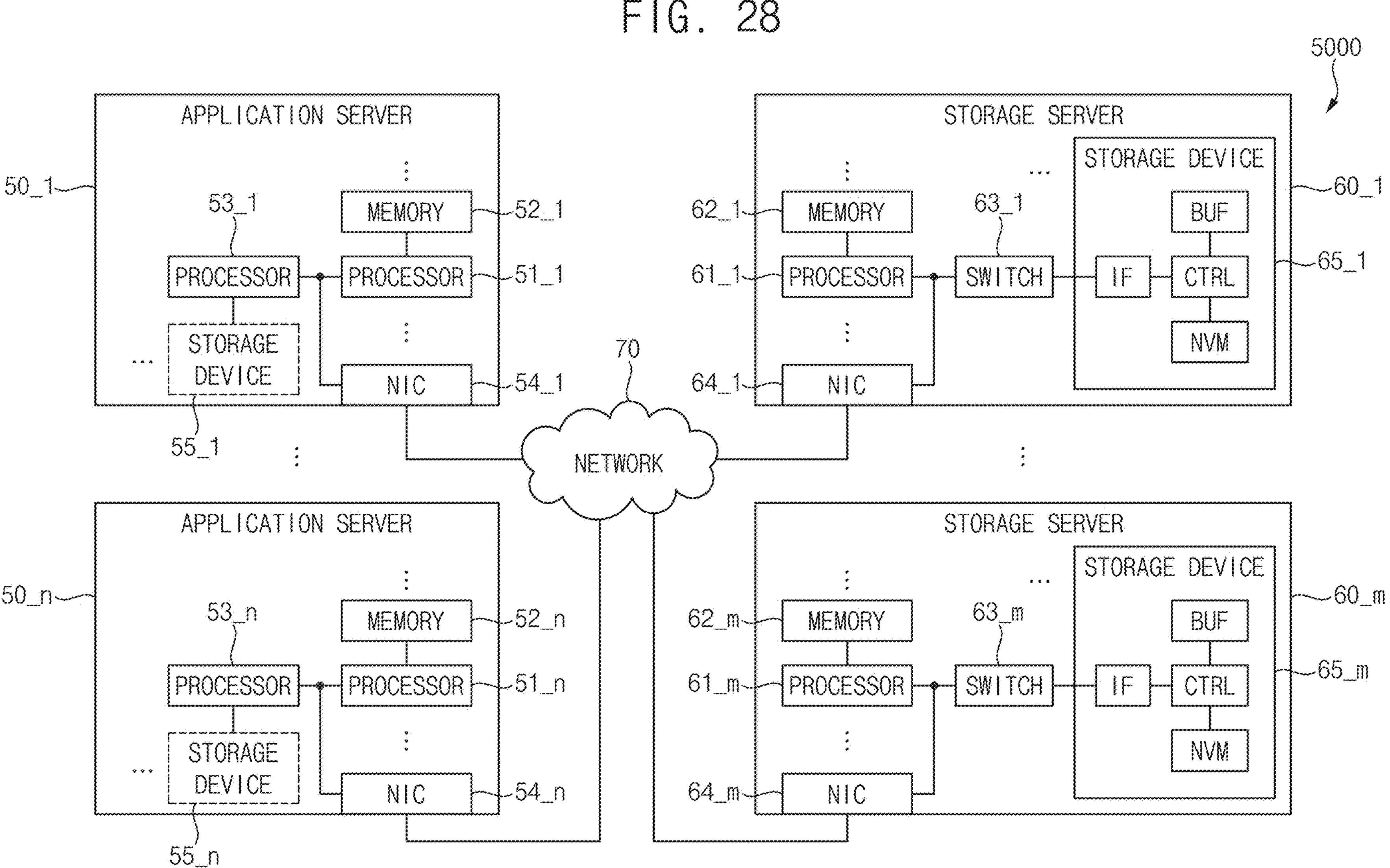
FIG. 28 is a block diagram illustrating a data center including a storage device according to example embodiments.

FIG. 28 is a block diagram illustrating a data center including a storage device according to example embodiments.

In some example embodiments, the system described above with reference to the drawings may serve as an application server and/or a storage server and be included in a data center 5000. The error management according to example embodiments may be applied to each of the application server and/or the storage server.

Referring to FIG. 28, the data center 5000 may collect various pieces of data and provide services and be also referred to as a data storage center. For example, the data center 5000 may be a system configured to operate a search engine and a database or a computing system used by companies, such as banks, or government agencies. As shown in FIG. 28, the data center 5000 may include application servers 50_1 to **50_*n* and storage servers 60_1 to 60_*m* (where, each of m and n is an integer more than 1). The number n of application servers 50_1 to 50_*n* and the number m of storage servers 60_1 to 60_*m* may be variously selected according to example embodiments. In some example embodiments, the number n of application servers 50_1 to 50_*n* may be different from the number m of storage servers 60_1 to 60_*m***.

The application servers 50_1 to **50_*n* may include any one or any combination of processors 51_1 to 51_*n*, memories 52_1 to 52_*n*, switches 53_1 to 53_*n*, NICs 54_1 to 54_*n*, and storage devices 55_1 to 55_*n*. The processors 51_1** to 51_n may control all operations of the application servers 50_1 to 50_n, access the memories 52_1 to 52_n, and execute instructions and/or data loaded in the memories 52_1 to 52_n. Non-limiting examples of the memories 52_1 to 52_n may include DDR SDRAM, a high-bandwidth memory (HBM), a hybrid memory cube (HMC), a dual in-line memory module (DIMM), a Optane DIMM, or a nonvolatile DIMM (NVDIIMM).

According to example embodiments, the numbers of processors and memories included in the application servers 50_1 to 50_n may be variously selected according to example embodiments. In some example embodiments, the processors 51_1 to 51_n and the memories 52_1 to 52_n may provide processor-memory pairs. In some example embodiments, the number of processors 51_1 to 51_n may be different from the number of memories 52_1 to 52_n. The processors 51_1 to 51_n may include a single core processor or a multi-core processor. In some example embodiments, as illustrated with a dashed line in FIG. 28, the storage devices 55_1 to 55_n may be omitted from the application servers 50_1 to 50_n. The number of storage devices 55_1 to 55_n included in the storage servers 50_1 to 50_n may be variously selected according to example embodiments. The processors 51_1 to 51_n, the memories 52_1 to 52_n, the switches 53_1 to 53_n, the NICs 54_1 to 54_n, and/or the storage devices 55_1 to 55_n may communicate with each other through a link described above with reference to the drawings.

The storage servers 60_1 to 60_m may include any one or any combination of processors 61_1 to 61_m, memories 62_1 to 62_m, switches 63_1 to 63_m, NICs 64_1 to 64_n, and storage devices 65_1 to 65_m. The processors 61_1 to 61_m and the memories 62_1 to 62_m may operate similar to the processors 51_1 to 51_n and the memories 52_1 to 52_n of the application servers 50_1 to 50_n described above.

The application servers 50_1 to 50_n may communicate with the storage servers 60_1 to 60_m through a network 70. In some example embodiments, the network 70 may be implemented using a fiber channel (FC) or Ethernet. The FC may be a medium used for relatively high-speed data transfer. An optical switch that provides high performance and high availability may be used as the FC. The storage servers 60_1 to 60_m may be provided as file storages, block storages, or object storages according to an access method of the network 70.

In some example embodiments, the network 70 may be a storage-only network, such as a storage area network (SAN). For example, the SAN may be an FC-SAN, which may use an FC network and be implemented using an FC Protocol (FCP). In another case, the SAN may be an Internet protocol (IP)-SAN, which uses a transmission control protocol/Internet protocol (TCP/IP) network and is implemented according to an SCSI over TCP/IP or Internet SCSI (iSCSI) protocol. In some example embodiments, the network 70 may be a general network, such as a TCP/IP network. For example, the network 70 may be implemented according to a protocol, such as FC over Ethernet (FCOE), network attached storage (NAS), nonvolatile memory express (NVMe) over fabrics (NVMe-oF).

The application server 50_1 and the storage server 60_1 will mainly be described, but it may be noted that a description of the application server 50_1 may be also applied to another application server (e.g., 50_n), and a description of the storage server 60_1 may be also applied to another storage server (e.g., 60_m).

The application server 50_1 may store data, which is requested to be stored by a user or a client, in one of the storage servers 60_1 to 60_m through the network 70. In some example embodiments, the application server 50_1 may obtain data, which is requested to be read by the user or the client, from one of the storage servers 60_1 to 60_m through the network 70. For example, the application server 50_1 may be implemented using a web server or a database management system (DBMS).

The application server 50_1 may access the memory 52_n and/or the storage device 55_n included in another application server 50_n, through the network 70, and/or access the memories 62_1 to 62_m and/or the storage devices 65_1 to 65_m included in the storage servers 60_1 to 60_m, through the network 70. Accordingly, the application server 50_1 may perform various operations on data stored in the application servers 50_1 to 50_n and/or the storage servers 60_1 to 60_m. For example, the application server 50_1 may execute an instruction to migrate or copy data between the application servers 50_1 to 50_n and/or the storage servers 60_1 to 60_m. In this case, the data may be migrated from the storage devices 65_1 to 65_m of the storage servers 60_1 to 60_m to the memories 52_1 to 52_n of the application servers 50_1 to 50_n through the memories 62_1 to 62_m of the storage servers 60_1 to 60_m or directly. In some example embodiments, the data migrated through the network 70 may be encrypted data for security or privacy.

In the storage server 60_1, an interface IF may provide physical connection between the processor 61_1 and a controller CTRL and physical connection between the NIC 64_1 and the controller CTRL. For example, the interface IF may be implemented using a direct attached storage (DAS) method in which the storage device 65_1 is directly connected to a dedicated cable. For example, the interface IF may be implemented using various interface methods, such as advanced technology attachment (ATA), serial ATA (SATA), external SATA (e-SATA), small computer small interface (SCSI), serial attached SCSI (SAS), PCI, PCIe, NVMe, IEEE 1394, a universal serial bus (USB), a secure digital (SD) card, a multi-media card (MMC), an embedded MMC (eMMC), a UFS, an embedded UFS (eUFS), and a compact flash (CF) card interface.

In the storage server 60_1, the switch 63_1 may selectively connect the processor 61_1 to the storage device 65_1 or selectively connect the NIC 64_1 to the storage device 65_1 based on the control of the processor 61_1.

In some example embodiments, the NIC 64_1 may include a network interface card (NIC) and a network adaptor. The NIC 54_1 may be connected to the network 70 through a wired interface, a wireless interface, a Bluetooth interface, or an optical interface. The NIC 54_1 may include an internal memory, a digital signal processor (DSP), and a host bus interface and be connected to the processor 61_1 and/or the switch 63_1 through the host bus interface. In some example embodiments, the NIC 64_1 may be integrated with any one or any combination of the processor 61_1, the switch 63_1, and the storage device 65_1.

In the application servers 50_1 to 50_n or the storage servers 60_1 to 60_m, the processors 51_1 to 51_m and 61_1 to 61_n may transmit commands to the storage devices 55_1 to 55_n and 65_1 to 65_m or the memories 52_1 to 52_n and 62_1 to 62_m and program or read data. In this case, the data may be data of which an error is corrected by an error correction code (ECC) engine. The data may be data processed with data bus inversion (DBI) or data masking (DM) and include cyclic redundancy Code (CRC) information. The data may be encrypted data for security or privacy.

In response to read commands received from the processors 51_1 to 51_*m* and 61_1 to 61_*n*, the storage devices 55_1 to 55_*n* and 65_1 to 65_*m* may transmit control signals and command/address signals to a nonvolatile memory device (e.g., a NAND flash memory device) NVM. Accordingly, when data is read from the nonvolatile memory device NVM, a read enable signal may be input as a data output control signal to output the data to a DQ bus. A data strobe signal may be generated using the read enable signal. The command and the address signal may be latched according to a rising edge or falling edge of a write enable signal.

The controller CTRL may control all operations of the storage device 65_1. In example embodiments, the controller CTRL may include static RAM (SRAM). The controller CTRL may write data to the nonvolatile memory device NVM in response to a write command or read data from the nonvolatile memory device NVM in response to a read command. For example, the write command and/or the read command may be generated based on a request provided from a host (e.g., the processor 61_1 of the storage server 60_1, the processor 61_*m* of another storage server 60_*m*, or the processors 51_1 to 51_*n* of the application servers 50_1 to 50_*n*). A buffer BUF may temporarily store (or buffer) data to be written to the nonvolatile memory device NVM or data read from the nonvolatile memory device NVM. In some example embodiments, the buffer BUF may include DRAM. The buffer BUF may store metadata. The metadata may refer to user data or data generated by the controller CTRL to manage the nonvolatile memory device NVM. The storage device 65_1 may include a secure element (SE) for security or privacy.

According to the above-described example embodiments, the storage devices 55_1 to 55_*n* and 65_1 to 65_*m* may measure at least one of the program execution time required to perform the write operation and the erase execution time required to perform the erase operation to provide degradation information. At least one of the program voltage for the write operation and the erase voltage for the erase operation may be adjusted based on at least one of the program execution time and the erase execution time.

As described above, the nonvolatile memory device according to example embodiments may measure at least one of a program execution time and an erase execution time to provide degeneration information indicative of an actual degree of degeneration of the nonvolatile memory device. Based on the measured degeneration information, the storage controller may reduce the program voltage of the nonvolatile memory device to reflect the actual degree of degeneration, thereby reducing stress on the nonvolatile memory cells and improving performance and lifetime of the nonvolatile memory device and the storage device. Further, the storage controller may increase the erase voltage of the nonvolatile memory device to reflect the actual degree of degeneration based on the measured degeneration information, thereby reducing the erase time of the nonvolatile memory device and improving the performance of the nonvolatile memory device and the storage device.

Example embodiments may be applied to any electronic devices and systems. For example, example embodiments may be applied to systems such as a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IOT) device, an internet of everything (IoE) device, an e-book, a virtual reality (VR) device, an augmented reality (AR) device, a server system, an automotive driving system, a data center, etc.

In some example embodiments, each of the components represented by a block as illustrated in FIGS. 6A, 7, 12-14 and 28 may be implemented as various numbers of hardware and/or firmware structures that execute respective functions described above, according to example embodiments. For example, at least one of these components may include various hardware components including a digital circuit, a programmable or non-programmable logic device or array, an application specific integrated circuit (ASIC), transistors, capacitors, logic gates, or other circuitry using use a direct circuit structure, such as a memory, a processor, a logic circuit, a look-up table, etc., that may execute the respective functions through controls of one or more microprocessors or other control apparatuses. Also, at least one of these components may further include or may be implemented by a processor such as a central processing unit (CPU) that performs the respective functions, a microprocessor, or the like. Functional aspects of example embodiments may be implemented in algorithms that execute on one or more processors. Furthermore, the components, elements, modules or units represented by a block or processing steps may employ any number of related art techniques for electronics configuration, signal processing and/or control, data processing and the like.

While aspects of example embodiments have been particularly shown and described, it will be understood that various changes in form and details may be made therein without departing from the spirit and scope of the following claims.

What is claimed is:

1. A storage device comprising:

a NAND flash memory device configured to receive a command and an address for a write operation or an erase operation via command-address pins, transmit and receive write data or read data via data pins, and generate degeneration information indicating at least one of a program execution time required to perform the write operation and an erase execution time required to perform the erase operation; and a storage controller configured to receive the degeneration information from the NAND flash memory device, and control the NAND flash memory device to adjust at least one of a program voltage of the write operation and an erase voltage of the erase operation based on the degeneration information, wherein the storage controller is configured to adjust the program voltage to a first voltage level based on the program execution time indicated by the degeneration information being within a first interval, and adjust the program voltage to a second voltage level different from the first voltage level based on the program execution time indicated by the degeneration information being within a second interval different from the first interval.

2. The storage device of claim 1, wherein the NAND flash memory device is further configured to transmit the degeneration information to the storage controller via the command-address pins.

3. The storage device of claim 1, wherein the storage controller is further configured to control the NAND flash memory device to decrease the program voltage based on the degeneration information indicating a decrease in the program execution time.

4. The storage device of claim 1, wherein the storage controller is further configured to control the NAND flash memory device to increase the erase voltage based on the degeneration information indicating an increase in the erase execution time.

5. The storage device of claim 1, wherein the NAND flash memory device is further configured to update the degeneration information by measuring the program execution time and the erase execution time each time a program-erase count reaches any of a plurality of reference counts.

6. The storage device of claim 1, wherein the NAND flash memory device is further configured to update the degeneration information by measuring the program execution time and the erase execution time based on a request from the storage controller.

7. The storage device of claim 1, wherein the NAND flash memory device is further configured to provide, to the storage controller, a state signal that is activated at a first logic level indicating a ready state while in the ready state and deactivated at a second logic level indicating a busy state while performing internal operations for the write operation or the erase operation, and wherein the NAND flash memory device is further configured to measure the program execution time or the erase execution time based on a time interval while the state signal is deactivated to the second logic level during the write operation or the erase operation.

8. The storage device of claim 7, wherein the NAND flash memory device is further configured to receive the command and the address in synchronization with a command-address clock signal provided from the storage controller, and wherein the NAND flash memory device is further configured to measure the program execution time by counting clock cycles of the command-address clock signal while the state signal is deactivated to the second logic level during the write operation.

9. The storage device of claim 1, wherein the NAND flash memory device is further configured to operate according to Separate Command Address (SCA) protocol.

10. The storage device of claim 1, wherein the nonvolatile NAND flash memory device is further configured to set at least one target wordline among wordlines of a memory block and measure the program execution time with respect to the at least one target wordline.

11. The storage device of claim 1, wherein the NAND flash memory device is further configured to measure the program execution time with respect to each of a plurality of wordlines of a memory block to obtain a plurality of program execution times, and control the program voltage with respect to the memory block based on an average value of the plurality of program execution times.

12. The storage device of claim 1, wherein the NAND flash memory device is further configured to:

perform the write operation in accordance with incremental step pulse programming (ISPP);

incrementally increase the program voltage as a program loop is repeated; and measure the program execution time based on a number of program loops performed to complete the write operation.

13. The storage device of claim 1, wherein the NAND flash memory device is further configured to:

perform the erase operation in accordance with an incremental step pulse erasing (ISPE), increase the erase voltage step by step as an erase loop is repeated; and measure the erase execution time based on a number of erase loops performed to complete the erase operation.

14. The storage device of claim 1, wherein the NAND flash memory device is further configured to:

perform the write operation in accordance with incremental step pulse programming (ISPP);

incrementally increase the program voltage as a program loop is repeated; and decrease the program voltage of a first program loop of the ISPP based on the degeneration information indicating an increased degree of degeneration of the NAND flash memory device.

15. The storage device of claim 1, wherein the NAND flash memory device is further configured to perform the erase operation in accordance with an incremental step pulse erasing (ISPE), and incrementally increase the erase voltage step by step as an erase loop is repeated, and wherein the storage controller is further configured to control the NAND flash memory device to increase the erase voltage of a first erase loop of the ISPE based on the degeneration information indicating an increased degree of degeneration of the NAND flash memory device.

16. A method of operating a storage device including a NAND flash memory device and a storage controller configured to control the NAND flash memory device, comprising:

generating degeneration information indicating at least one of a program execution time required to perform a write operation and an erase execution time required to perform an erase operation of the NAND flash memory device;

providing the degeneration information from the NAND flash memory device to the storage controller; and controlling the NAND flash memory device to adjust at least one of a program voltage of the write operation and an erase voltage of the erase operation based on the degeneration information, wherein the controlling the NAND flash memory device comprises adjusting the program voltage to a first voltage level based on the program execution time indicated by the degeneration information being within a first interval, and adjusting the program voltage to a second voltage level different from the first voltage level based on the program execution time indicated by the degeneration information being within a second interval different from the first interval.

17. The method of claim 16, wherein the generating the degeneration information comprises:

generating a state signal that is activated at a first logic level indicating a ready state while in the ready state and deactivated at a second logic level indicating a busy state while performing internal operations for the write operation or the erase operation; and measuring the program execution time or the erase execution time based on a time interval while the state signal is deactivated to the second logic level during the write operation or the erase operation.

18. The method of claim 16, wherein controlling the NAND flash memory device comprises controlling the NAND flash memory device to decrease the program voltage based on the degeneration information indicating a decrease in the program execution time.

19. The method of claim 16, wherein controlling the NAND flash memory device comprises controlling the NAND flash memory device to increase the erase voltage based on the degeneration information indicating an increase in the erase execution time.

20. A NAND flash memory device comprising:

a memory cell array comprising a plurality of nonvolatile memory cells;

command-address pins configured to communicate a command and an address for a write operation or an erase operation;

data pins configured to communicate write data and readout data;

a state pin configured to communicate a state signal that is activated at a first logic level indicating a ready state while in the ready state and deactivated at a second logic level indicating a busy state while performing internal operations for the write operation or the erase operation; and a degeneration detector circuit configured to generate degeneration information indicating at least one of a program execution time to perform the write operation and an erase execution time to perform the erase operation, based on the state signal, wherein the NAND flash memory device is configured to adjust a program voltage to a first voltage level based on the program execution time indicated by the degeneration information being within a first interval, and adjust the program voltage to a second voltage level different from the first voltage level based on the program execution time indicated by the degeneration information being within a second interval different from the first interval.

* * * * *